US012204051B2

United States Patent
Lu et al.

(10) Patent No.: US 12,204,051 B2
(45) Date of Patent: Jan. 21, 2025

(54) DETECTOR ARRAY DETECTION WITH HADAMARD PATTERN SCANNING

(71) Applicant: Beijing Voyager Technology Co., Ltd., Beijing (CN)

(72) Inventors: Yue Lu, Mountain View, CA (US); Youmin Wang, Mountain View, CA (US)

(73) Assignee: Beijing Voyager Technology Co., Ltd., Beijing (CN)

( * ) Notice: Subject to any disclaimer, the term of this patent is extended or adjusted under 35 U.S.C. 154(b) by 989 days.

(21) Appl. No.: 17/031,724

(22) Filed: Sep. 24, 2020

(65) Prior Publication Data

US 2022/0091235 A1    Mar. 24, 2022

(51) Int. Cl.
| | |
|---|---|
| G01S 7/484 | (2006.01) |
| G01S 7/481 | (2006.01) |
| G01S 7/4861 | (2020.01) |
| G01S 17/89 | (2020.01) |
| G01S 17/931 | (2020.01) |
| G02B 26/08 | (2006.01) |
| H04N 23/55 | (2023.01) |

(52) U.S. Cl.
CPC ............ G01S 7/484 (2013.01); G01S 7/4817 (2013.01); G01S 7/4861 (2013.01); G01S 17/89 (2013.01); G01S 17/931 (2020.01); G02B 26/085 (2013.01); H04N 23/55 (2023.01); B81B 2201/042 (2013.01)

(58) Field of Classification Search
CPC ............ G02B 26/0833; G01S 7/4817
See application file for complete search history.

(56) References Cited

U.S. PATENT DOCUMENTS

| | | | |
|---|---|---|---|
| 6,724,125 B2 * | 4/2004 | Hung .................... | H02N 1/006 310/309 |
| 2002/0057431 A1 * | 5/2002 | Fateley ............. | G02B 27/1013 356/330 |
| 2003/0184844 A1 | 10/2003 | Yazdi et al. | |

(Continued)

OTHER PUBLICATIONS

Evgeny Hahamovich and Amir Rosenthal "Ultrasound Detection Arrays via Coded Hadamard Apertures" Technion Israel Institute of Technology, May 24, 2020, 8 pages.

(Continued)

*Primary Examiner* — Yuqing Xiao
*Assistant Examiner* — Zhengqing Qi
(74) *Attorney, Agent, or Firm* — Kilpatrick Townsend & Stockton LLP

(57) ABSTRACT

An array of MEMS mirrors intercept a laser beam and redirect it toward an environment to be detected. A controller is configured to control the laser and the array of MEMS mirrors to generate a plurality of irregular patterns, such as a Hadamard pattern. The controller controls the laser and the array of MEMS mirrors to generate a plurality of Hadamard patterns on a single scan line at different times, such that all pixel positions in the scan line are impacted by one of the redirected beams from the mirror array at least once. The detected intensities of all the pixel reflections in each pattern are combined to give a total combined intensity for each of the different times. The Hadamard pattern is used to decode the various total combined intensities for a scan line to determine an intensity of each pixel in the scan line.

19 Claims, 15 Drawing Sheets

(56) References Cited

U.S. PATENT DOCUMENTS

| | | |
|---|---|---|
| 2005/0001163 A1 | 1/2005 | Belov |
| 2008/0106732 A1 | 5/2008 | Brady et al. |
| 2008/0253417 A1 | 10/2008 | Livingston |
| 2010/0033788 A1 | 2/2010 | Xie et al. |
| 2010/0078564 A1* | 4/2010 | McAllister ............... G01J 3/32 356/328 |
| 2012/0170088 A1 | 7/2012 | Opris et al. |
| 2014/0204385 A1* | 7/2014 | Ouyang ............... G01N 21/55 356/445 |
| 2017/0371030 A1 | 12/2017 | Pokrass et al. |
| 2019/0121121 A1 | 4/2019 | Galinski, III et al. |
| 2019/0391078 A1 | 12/2019 | Cohen et al. |
| 2022/0256066 A1* | 8/2022 | Riza ............... G02B 27/1013 |

OTHER PUBLICATIONS

E. E. Fenimore and T. M. Cannon "Coded aperture imaging with uniformly redundant arrays" Applied Optics, Feb. 1, 1978, vol. 17, No. 3, pp. 337-347, 11 pages.

\* cited by examiner

DETECTOR ARRAY DETECTION WITH HADAMARD PATTERN SCANNING

BACKGROUND OF THE INVENTION

Unless otherwise indicated herein, the materials described in this section are not prior art to the claims in this application and are not admitted to be prior art by inclusion in this section. In particular, disparate technologies are discussed that it would not be obvious to discuss together absent the teachings of the present invention.

Modern vehicles are often equipped with sensors designed to detect objects and landscape features around the vehicle in real-time to enable technologies such as lane change assistance, collision avoidance, and autonomous driving. Some commonly used sensors include image sensors (e.g., infrared or visible light cameras), acoustic sensors (e.g., ultrasonic parking sensors), radio detection and ranging (RADAR) sensors, magnetometers (e.g., passive sensing of large ferrous objects, such as trucks, cars, or rail cars), and light detection and ranging (LiDAR) sensors.

A LiDAR system typically uses a light source and a light detection system to estimate distances to environmental features (e.g., pedestrians, vehicles, structures, plants, etc.). For example, a LiDAR system may transmit a light beam (e.g., a pulsed laser beam) to illuminate a target and then measure the time it takes for the transmitted light beam to arrive at the target and then return to a receiver near the transmitter or at a known location. In some LiDAR systems, the light beam emitted by the light source may be steered across a two-dimensional or three-dimensional region of interest according to a scanning pattern, to generate a "point cloud" that includes a collection of data points corresponding to target points in the region of interest. The data points in the point cloud may be dynamically and continuously updated, and may be used to estimate, for example, a distance, dimension, location, and speed of an object relative to the LiDAR system.

Light steering typically involves the projection of light in a pre-determined direction to facilitate, for example, the detection and ranging of an object, the illumination and scanning of an object, or the like. Light steering can be used in many different fields of applications including, for example, autonomous vehicles, medical diagnostic devices, etc., and can be configured to perform both transmission and reception of light. For example, a light steering transmitter may include a micro-mirror to control the projection direction of light to detect/image an object. Moreover, a light steering receiver may also include a micro-mirror to select a direction of incident light to be detected by the receiver, to avoid detecting other unwanted signals. A micro-mirror assembly typically includes a micro-mirror and an actuator. In a micro-mirror assembly, a mirror-mirror can be connected to a substrate via a connection structure (e.g., a torsion bar, a spring, etc.) to form a pivot point. One such type of micro-mirror assembly can be a micro-electromechanical system (MEMS)-type structure that may be used for a light detection and ranging (LiDAR) system in an autonomous vehicle, which can be configured for detecting objections and determining their corresponding distances from the vehicle. LiDAR systems typically work by illuminating a target with an optical pulse and measuring the characteristics of the reflected return signal. The return signal is typically captured as a point cloud. The width of the optical-pulse often ranges from a few nanoseconds to several microseconds.

In a scanning based bi-axial LiDAR system, a common architecture is to use a detector array together with a 2D scanner. However, a large detector array is needed for high resolution. Moreover, a larger resolution means smaller optical divergence for each pixel. Eye safety standards limit the maximum laser power output in a given divergence angle, also known as the angular optical density. This in turn limits the maximum detection signal to noise ratio (SNR) of the system.

Another type of system is a flash LiDAR or scanning flash LiDAR that uses large divergence light output to project onto the field, covering a whole column of pixels at once. Larger divergence lifts the bars of maximum power output due to eye safety. The received light is focused through a condensing lens onto a array detector. However, a drawback is that every pixel of the vertical detector array needs to be read-out individually, which places a heavy burden of the read-out circuitry. It would be desirable to improve the signal-to-noise ratio without increasing the laser intensity for each pixel, and without requiring complex read-out circuitry.

BRIEF SUMMARY OF THE INVENTION

Techniques disclosed herein relate generally to microelectromechanical (MEMS) mirrors that can be used in, for example, light detection and ranging (LiDAR) systems or other light beam steering systems. More specifically, and without limitation, disclosed herein are MEMS micro-mirrors each including a mirror mass that moves to redirect a laser beam. With an array of micro-mirrors, multiple pixels are illuminated at once. However, simultaneous detection of multiple reflected beams can require complex circuitry. Various inventive embodiments minimize the need for complex circuitry while also allowing simultaneous detection and improving the SNR are described herein, including systems, modules, devices, components, circuits, materials, methods, and the like.

According to certain embodiments, a micro-electromechanical system (MEMS) apparatus has a MEMS mirror array structure for beam steering in a Light Detection and Ranging (LiDAR) system of an autonomous vehicle is provided. The apparatus has at least one laser for emitting at least one laser beam. An array of MEMS mirrors intercept the laser beam and redirect it toward an environment to be detected. At least one detector is provided for detecting reflected beams of the laser beam. A controller is configured to control the laser and the array of MEMS mirrors to generate a plurality of irregular patterns.

According to embodiments, the irregular pattern is a Hadamard pattern. The controller controls the laser and the array of MEMS mirrors to generate a plurality of Hadamard patterns on a single scan line at different times, such that all pixel positions in the scan line are impacted by one of the redirected beams from the mirror array at least once. The detected intensities of all the pixel reflections in each pattern are combined to give a total combined intensity for each of the different times. The Hadamard pattern is used to decode the various total combined intensities for a scan line to determine an intensity of each pixel in the scan line. The determined intensity will have a higher signal to noise ratio (SNR) than previous techniques. The process is then repeated for all the scans in a direction orthogonal to the scan line.

According to certain embodiments, the array of mirrors are controlled to tilt them at different angles to form the Hadamard pattern. The tilted mirrors project redirected laser beams to a different pixel positions, forming the coded Hadamard pattern. Several pixels may be skipped, or adjacent pixels may be illuminated, or a single pixel may be illuminated between non-illuminated pixels, forming the irregular pattern.

In one embodiment the plurality of mirrors are biased at different heights to form the irregular pattern with a diffractive pattern. Each mirror is moved vertically, rather than being tilted. By having the differences in heights of the mirrors be a fraction of the wavelength of the laser beam, a diffraction pattern is generated. The diffraction pattern will have a number of nodes that illuminate different pixels, such as a 0 order, $+/-1^{st}$ order, $+/-2^{nd}$ order and $+/-3^{rd}$ order nodes. In one embodiment, each mirror is connected to anchors via a flexible "string" of material, that allow the mirror to move vertically via electrostatic force due to a voltage biased between the mirror and an electrode below the mirror.

According to certain embodiments, the reflected beams are detected by either an array of detectors or a single detector. If an array of detectors is used, the outputs are ganged together to provide the single, combined intensity needed to decode the Hadamard pattern.

The terms and expressions that have been employed are used as terms of description and not of limitation, and there is no intention in the use of such terms and expressions of excluding any equivalents of the features shown and described or portions thereof. It is recognized, however, that various modifications are possible within the scope of the systems and methods claimed. Thus, it should be understood that, although the present system and methods have been specifically disclosed by examples and optional features, modification and variation of the concepts herein disclosed should be recognized by those skilled in the art, and that such modifications and variations are considered to be within the scope of the systems and methods as defined by the appended claims.

This summary is not intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim.

The foregoing, together with other features and examples, will be described in more detail below in the following specification, claims, and accompanying drawings.

BRIEF DESCRIPTION OF THE DRAWINGS

The features of the various embodiments described above, as well as other features and advantages of certain embodiments of the present invention will, be more apparent from the following detailed description taken in conjunction with the accompanying drawings, in which.

DETAILED DESCRIPTION OF THE INVENTION

Figure 1:
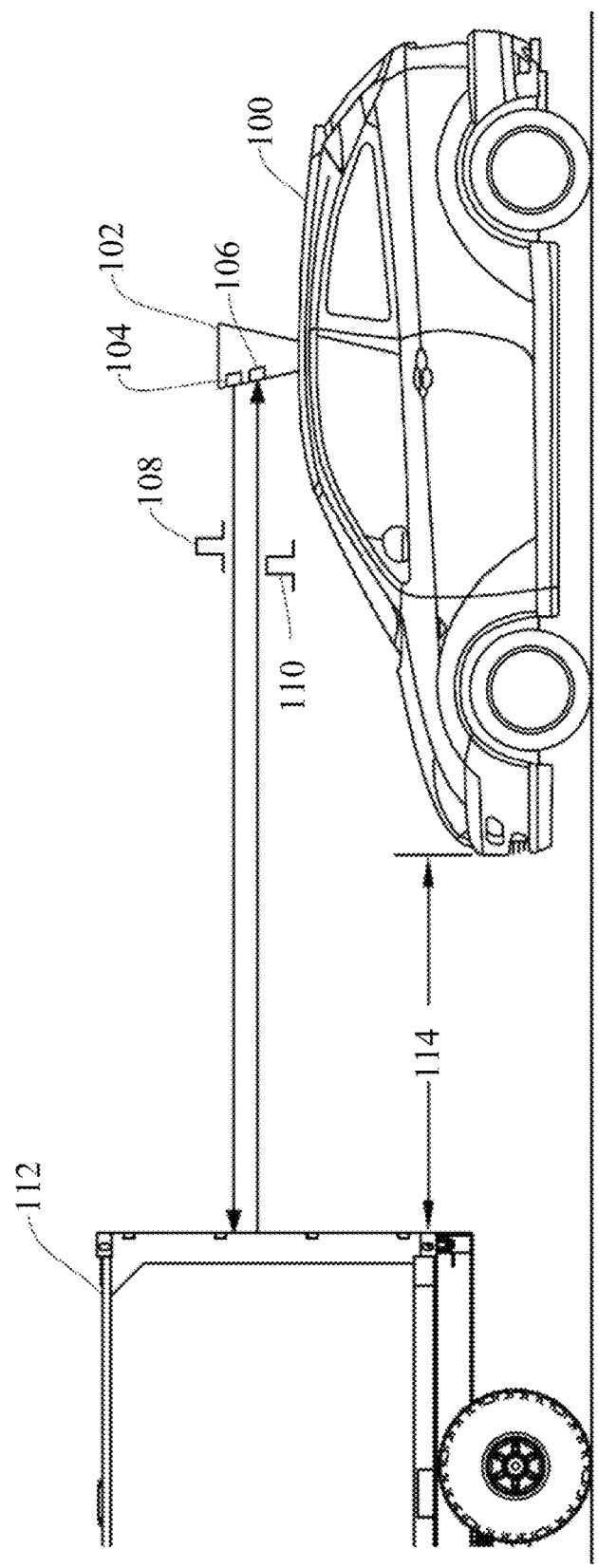
FIG. 1 shows an autonomous vehicle with a LiDAR system, according to certain embodiments.

Aspects of the present disclosure relate generally to a LiDAR system, and more particularly to scanning an environment with a laser and MEMS-based mirror arrays.

In the following description, various examples of MEMS-based micro mirror structures are described. For purposes of explanation, specific configurations and details are set forth in order to provide a thorough understanding of the embodiments. However, it will be apparent to one skilled in the art that certain embodiments may be practiced or implemented without every detail disclosed. Furthermore, well-known features may be omitted or simplified in order to prevent any obfuscation of the novel features described herein.

The following high level summary is intended to provide a basic understanding of some of the novel innovations depicted in the figures and presented in the corresponding descriptions provided below. Techniques disclosed herein relate generally to microelectromechanical (MEMS) mirrors that can be used in, for example, light detection and ranging (LiDAR) systems or other light beam steering systems. More specifically, and without limitation, disclosed herein are a MEMS micro-mirror array for a scan line. The array of MEMS mirrors intercept the laser beam and redirect it toward an environment to be detected. At least one detector is provided for detecting reflected beams of the laser beam. A controller is configured to control the laser and the array of MEMS mirrors to generate a plurality of irregular patterns.

According to embodiments, the irregular pattern is a Hadamard pattern. The controller controls the laser and the array of MEMS mirrors to generate a plurality of Hadamard patterns on a single scan line at different times, such that all pixel positions in the scan line are impacted by one of the redirected beams from the mirror array at least once. The detected intensities of all the pixel reflections in each pattern are combined to give a total combined intensity for each of the different times. The Hadamard pattern is used to decode the various total combined intensities for a scan line to determine an intensity of each pixel in the scan line. The process is then repeated for all the scans in a direction orthogonal to the scan line.

According to an embodiment illustrated in FIG. 5 and discussed below, the array of mirrors are controlled to tilt them at different angles to form the Hadamard pattern. The tilted mirrors project the redirected laser beams to different pixel positions, forming the coded Hadamard pattern.

In another embodiment illustrated in FIG. 6A and discussed below, the plurality of mirrors are biased at different heights to form the irregular pattern with a diffractive pattern. Each mirror in the array is moved vertically, rather than being tilted. The mirrors are biased at different vertical heights. By having the differences in heights of the mirrors be a fraction of the wavelength of the laser beam, a diffraction pattern is generated.

Generally, aspects of the invention are directed to implementations of light steering, which can be used in a number of different applications. For example, a Light Detection and Ranging (LiDAR) module of an autonomous vehicle may incorporate a light steering system. The light steering system can include a transmitter and receiver system to steer emitted incident light in different directions around a vehicle, and to receive reflected light off of objects around the vehicle using a sequential scanning process, which can be used to determine distances between the objects and the vehicle to facilitate autonomous navigation.

Light steering can be implemented by way of micro-mirror assemblies as part of an array, with each micro-mirror assembly having a movable micro-mirror and an actuator (or multiple actuators). The micro-mirrors and actuators can be formed as microelectromechanical systems (MEMS) on a semiconductor substrate, which allows for the integration of the MEMS with other circuitries (e.g., controller, interface circuits, etc.) on the semiconductor substrate, which can allow for simpler, easier, more robust, and cost-effective manufacturing processes.

In a micro-mirror assembly, a micro-mirror can be mechanically connected (e.g., "anchored") to the semiconductor substrate via a connection structure (e.g., torsion bar, torsion spring, torsion beam, etc.) to form a pivot point and an axis of rotation. As described herein, "mechanically connected," or "connected," can include a direct connection or an indirect connection. For example, the micro-mirror can be indirectly connected to the substrate via a connection structure (e.g., torsion bar or torsion spring) to form a pivot/connection point. The micro-mirror can be rotated around the pivot/connection point ("referred to herein as a pivot point") on the axis of rotation by an actuator. An electrostatic actuator is typically used; however, any suitable type of actuator may be implemented (e.g., piezoelectric, thermal mechanical, etc.), and one of ordinary skill in the art with the benefit of this disclosure would appreciate the many modifications, combinations, variations, and alternative embodiments thereof.

In some embodiments, each micro-mirror can be configured to be rotated by a rotation angle or moved vertically to reflect (and steer) light towards a target direction. For rotation, the connection structure can be deformed to accommodate the rotation, but the connection structure also has a degree of spring stiffness, which varies with the rotation angle and counters the rotation of the micro-mirror to set a target rotation angle. To rotate a micro-mirror by a target rotation angle, an actuator can apply a torque to the micro-mirror based on the rotational moment of inertia of the mirror, as well as the degree of spring stiffness for a given target rotation angle. Different torques can be applied to rotate (e.g., oscillate) the micro-mirror at or near a resonant frequency to achieve different target rotation angles. The actuator can then remove the torque, and the connection structure can return the micro-mirror back to its default orientation for the next rotation. A vertical actuator, such as an electrostatic force actuator, or a thermal actuator with a piston, can be used in embodiments. The rotation or vertical displacement of the micro-mirror can be repeated in the form of an oscillation, typically at or near a resonant frequency of the micro-mirror based on the mass of the micro-mirror and the spring constant of the connection structure.

In certain embodiments, each micro-mirror can be rotated around two orthogonal axes to provide a first range of angles of projection along a vertical dimension and to provide a second range of angles of projection along a horizontal dimension. The first range and the second range of angles of projection can define a two-dimensional field of view (FOV) in which light is projected to detect/scan an object. The FOV can also define a two-dimensional range of directions of incident lights that can be reflected by the object and detected by the receiver. Less commonly, LiDAR systems may also operate over a single axis (e.g., along a horizontal direction). One of ordinary skill in the art with the benefit of this disclosure would appreciate the many implementations and alternative embodiments thereof.

Typical System Environment for Certain Embodiments of the Invention

FIG. 1 illustrates an autonomous vehicle 100 in which the various embodiments described herein can be implemented. Autonomous vehicle 100 can include a LiDAR module 102. LiDAR module 102 allows autonomous vehicle 100 to perform object detection and ranging in a surrounding environment. Based on the result of object detection and ranging, autonomous vehicle 100 can drive according to the rules of the road and maneuver to avoid a collision with detected objects. LiDAR module 102 can include a light steering transmitter 104 and a receiver 106. Light steering transmitter 104 can project one or more light signals 108 at various directions (e.g., incident angles) at different times in any suitable scanning pattern, while receiver 106 can monitor for a light signal 110 which is generated by the reflection of light signal 108 by an object. Light signals 108 and 110 may include, for example, a light pulse, a frequency modulated continuous wave (FMCW) signal, an amplitude modulated continuous wave (AMCW) signal, etc. LiDAR module 102 can detect the object based on the reception of light signal 110, and can perform a ranging determination (e.g., a distance of the object) based on a time difference between light signals 108 and 110, as would be appreciated by one of ordinary skill in the art with the benefit of this disclosure. For example, as shown in FIG. 1, LiDAR module 102 can transmit light signal 108 at a direction directly in front of autonomous vehicle 100 at time T1 and receive light signal 110 reflected by an object 112 (e.g., another vehicle) at time T2. Based on the reception of light signal 110, LiDAR module 102 can determine that object 112 is directly in front of autonomous vehicle 100. Moreover, based on the time difference between T1 and T2, LiDAR module 102 can also determine a distance 114 between autonomous vehicle 100 and object 112. Autonomous vehicle 100 can thereby adjust its speed (e.g., slowing or stopping) to avoid collision with object 112 based on the detection and ranging of object 112 by LiDAR module 102.

Figure 2A:
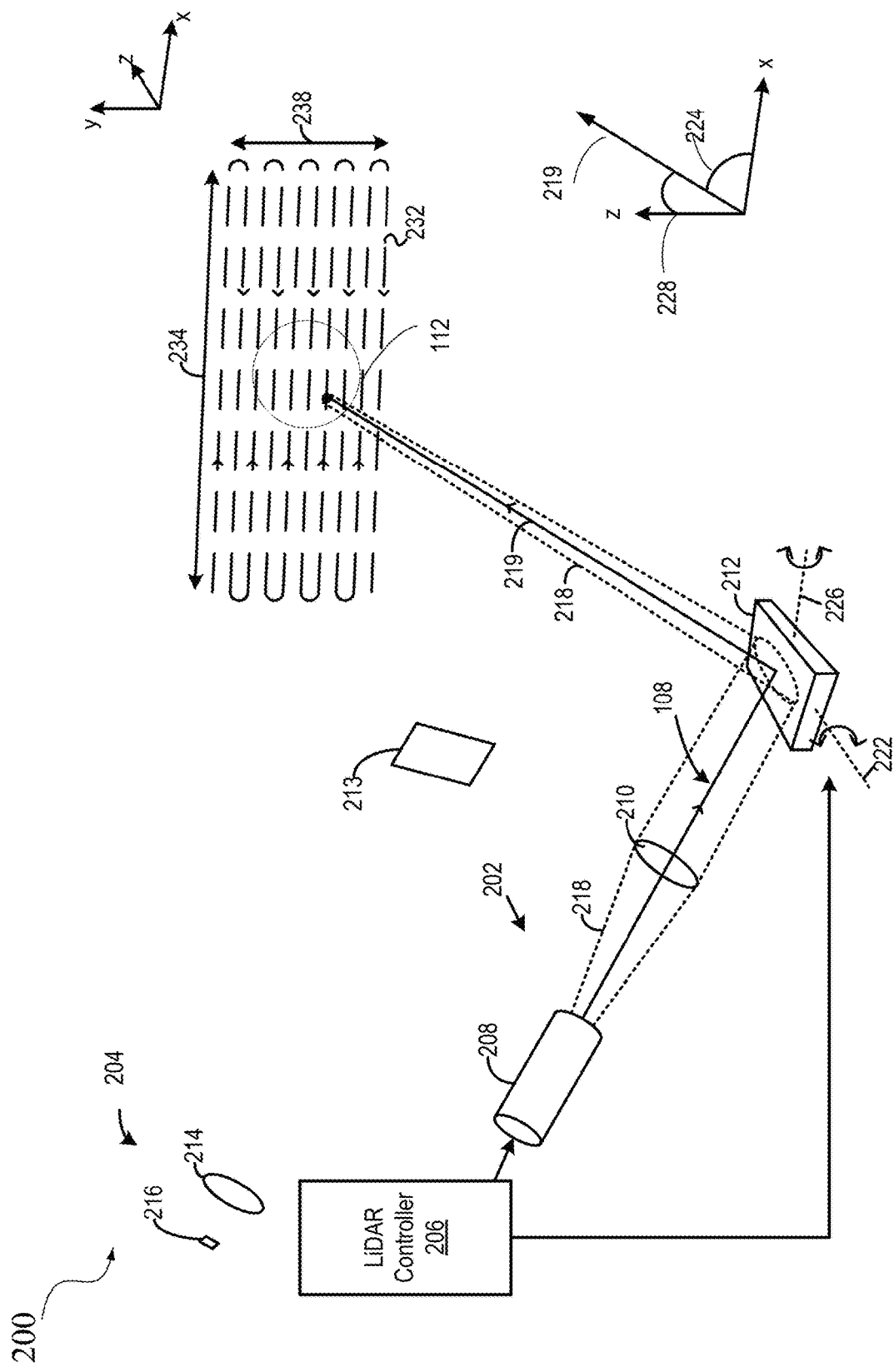
FIG. 2A shows an example of a light projection operation, according to certain embodiments.
Figure 2B:
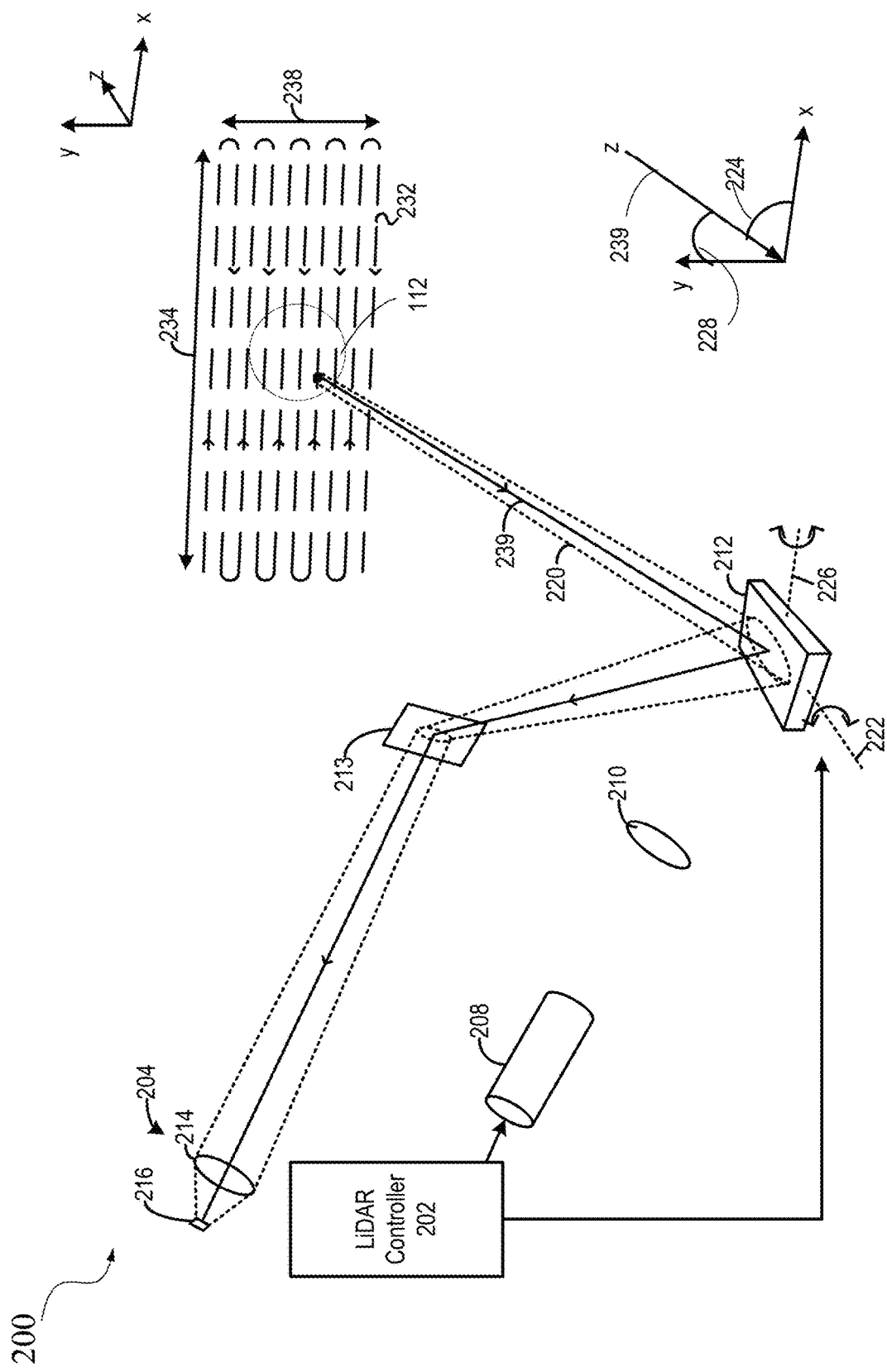
FIG. 2B shows an example of a light detection operation, according to certain embodiments.

FIG. 2A and FIG. 2B illustrate simplified block diagrams of an example of a LiDAR module 200 according to certain embodiments. LiDAR module 200 may be an example of LiDAR system 102, and may include a transmitter 202, a receiver 204, and LiDAR controller 206, which may be configured to control the operations of transmitter 202 and receiver 204. Transmitter 202 may include a light source 208 and a collimator lens 210, and receiver 204 can include a lens 214 and a photodetector 216. LiDAR module 200 may further include a mirror assembly 212 (also referred to as a "mirror structure") and a beam splitter 213. In some embodiments, LiDAR module 102, transmitter 202 and receiver 204 can be configured as a coaxial system to share mirror assembly 212 to perform light steering operations, with beam splitter 213 configured to reflect incident light reflected by mirror assembly 212 to receiver 204.

FIG. 2A shows an example of a light projection operation, according to certain embodiments. To project light, LiDAR controller 206 can control light source 208 (e.g., a pulsed laser diode, a source of FMCW signal, AMCW signal, etc.) to transmit light signal 108 as part of light beam 218. Light beam 218 can disperse upon leaving light source 208 and can be converted into collimated light beam 218 by collimator lens 210. Collimated light beam 218 can be incident upon a mirror assembly 212, which can reflect collimated light beam 218 to steer it along an output projection path 219 towards object 112. Mirror assembly 212 can include one or more rotatable mirrors. FIG. 2A illustrates mirror assembly 212 as having one mirror; however, a micro-mirror array may include multiple micro-mirror assemblies that can collectively provide the steering capability described herein. Mirror assembly 212 can further include one or more actuators (not shown in FIG. 2A) to rotate the rotatable mirrors. The actuators can rotate the rotatable mirrors around a first axis 222, and can rotate the rotatable mirrors along a second axis 226. The rotation around first axis 222 can change a first angle 224 of output projection path 219 with respect to a first dimension (e.g., the x-axis), whereas the rotation around second axis 226 can change a second angle 228 of output projection path 219 with respect to a second dimension (e.g., the z-axis). LiDAR controller 206 can control the actuators to produce different combinations of angles of rotation around first axis 222 and second axis 226 such that the movement of output projection path 219 can follow a scanning pattern 232. A range 234 of movement of output projection path 219 along the x-axis, as well as a range 238 of movement of output projection path 219 along the z-axis, can define a FOV. An object within the FOV, such as object 112, can receive and reflect collimated light beam 218 to form reflected light signal, which can be received by receiver 204 and detected by the LiDAR module, as further described below with respect to FIG. 2B. In certain embodiments, mirror assembly 212 can include one or more comb spines with comb electrodes (see, e.g., FIG. 3), as will be described in further detail below.

FIG. 2B shows an example of a light detection operation, according to certain embodiments. LiDAR controller 206 can select an incident light direction 239 for detection of incident light by receiver 204. The selection can be based on setting the angles of rotation of the rotatable mirrors of mirror assembly 212, such that only light beam 220 propagating along light direction 239 gets reflected to beam splitter 213, which can then divert light beam 220 to photodetector 216 via collimator lens 214. With such arrangements, receiver 204 can selectively receive signals that are relevant for the ranging/imaging of object 112 (or any other object within the FOV), such as light signal 110 generated by the reflection of collimated light beam 218 by object 112, and not to receive other signals. As a result, the effect of environmental disturbance on the ranging and imaging of the object can be reduced, and the system performance may be improved.

Detector Array Detection with Hadamard Pattern Scanning

Embodiments of the invention provide a novel method for spatial multiplexing of transmitted laser signals that is based on scanning coded-Hadamard-aperture (CHA) masks before projecting into the environment.

The concept of using a coded aperture originally replaced the single opening of a simple pinhole camera with many pinholes (called collectively the aperture) arranged randomly. Subsequent processing of the picture yields the reconstructed image which should resemble the original object The original motivation was to obtain an imaging system which maintained the high angular resolution of a single pinhole but produced images that have a Signal-to-Noise-Ratio (SNR) commensurate with the total open area of the aperture. The technique is usually applied to x-ray imaging because most x-ray sources are so weak that a single pinhole camera would have to have a very large opening in order to obtain a reasonable SNR. The large hole precludes good angular resolution. If there are N pinholes in the aperture, the picture consists of N overlapping images of the object. The coded aperture technique (for a point source) can improve the SNR by roughly the square root of N when compared to the single pinhole camera. See, e.g., "Coded aperture imaging with uniformly redundant arrays," by E. E. Fenimore and T. M. Cannon, APPLIED OPTICS, February 1978, Vol. 17, No. 3, pp. 337-347.

Another application for coded-Hadamard-aperture (CHA) masks is ultrasound detection. Ultrasound is often performed with piezoelectric arrays that enable one to simultaneously map the acoustic fields at several positions. A single-element ultrasound detector can be transformed into an effective detection array by spatially filtering the incoming acoustic fields using a binary acoustic mask coded with cyclic Hadamard patterns. By scanning the mask in front of the detector, a multiplexed measurement dataset is obtained from which a map of the acoustic field which is analytically constructed. See, e.g., "Ultrasound Detection Arrays Via Coded Hadamard Apertures," by Evgeny Hahamovich and Amir Rosenthal, IEEE Xplore, Feb. 27, 2020. Coded Hadamard Apertures have also been used in sonar systems.

Embodiments of the invention, instead of using an aperture, use an array of MEMS mirrors to redirect beams of light onto the environment as a Hadamard pattern. Compared with single point based scanning architecture, laser energy is diverged in different directions, therefore total output power can be increased. The returning light from all angular directions are collected together in a single detector, therefore eliminating the need for multi-channel detection. Moreover, the achieved sensitivity gain with respect to a single aperture (point-by-point scanning) fits the theoretical Hadamard pattern prediction of $\sqrt{N}/2$, where N is the number of emulated scanning points. To ensure covering all angular directions, multiple coded Hadamard aperture patterns are projected and measured along one horizontal direction. Through post-detection calculations, the light intensity from each angle can be calculated, and compressed-sensing algorithms are used for image reconstruction. The realization of coded Hadamard aperture masks is done on the transmission side in embodiments of the present invention. Two different embodiments of such an inventive device are shown in FIGS. 5 and 6 below.

Figure 3:
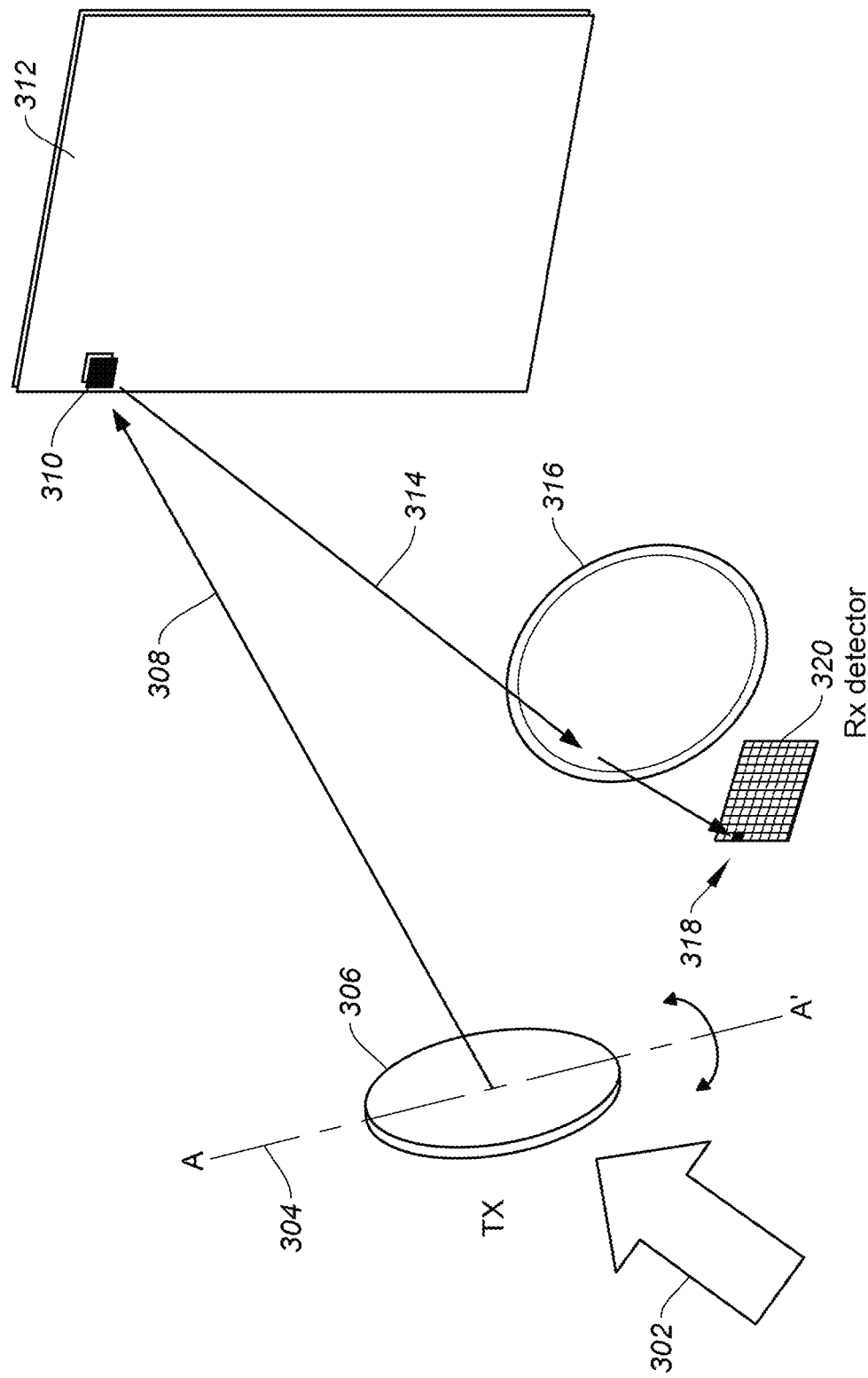
FIG. 3 is a diagram of a prior art MEMS mirror point scanning system with a detector array used in a bi-axial LiDAR system.

FIG. 3 is a diagram of a prior art MEMS mirror point scanning system with a detector array used in a bi-axial LiDAR system. This is a common architecture which uses a detector array together with a 2D scanner. As shown in FIG.

3, a laser beam 302 is reflected off of a MEMS mirror 306 rotated at an angle about an axis 304. The reflected beam 308 is projected into the environment 312, reflecting off an object at a pixel position 310 as reflected beam 314. The reflected beam can be redirected by the same or another MEMS mirror 316 at a different angle to redirect the returning beam to a receiver detector 320 at a pixel position 318. Typically, the laser has lower divergence so that it can be well focused. 1° resolution in the vertical direction will typically require 200 lines. This is useful for smaller resolution systems, such as the face recognition used in phones and tablets.

The technological challenge of this architecture is that when the resolution requirement is high, a large detector array 320 is needed. Considering that current state-of-the-art large detector arrays (e.g., Single Photon Avalanche Diode (SPAD) arrays) usually have a pixel array size smaller than 1M pixels, there's still a long way to go before realization of a single point scanning based system. Moreover, the larger the resolution the smaller the optical divergence for each pixel. Eye safety standards limit the maximum laser power output in a given divergence angle, a.k.a. the angular optical density. This in return limits the maximum detection signal to noise ratio (SNR) of the system.

Figure 4:
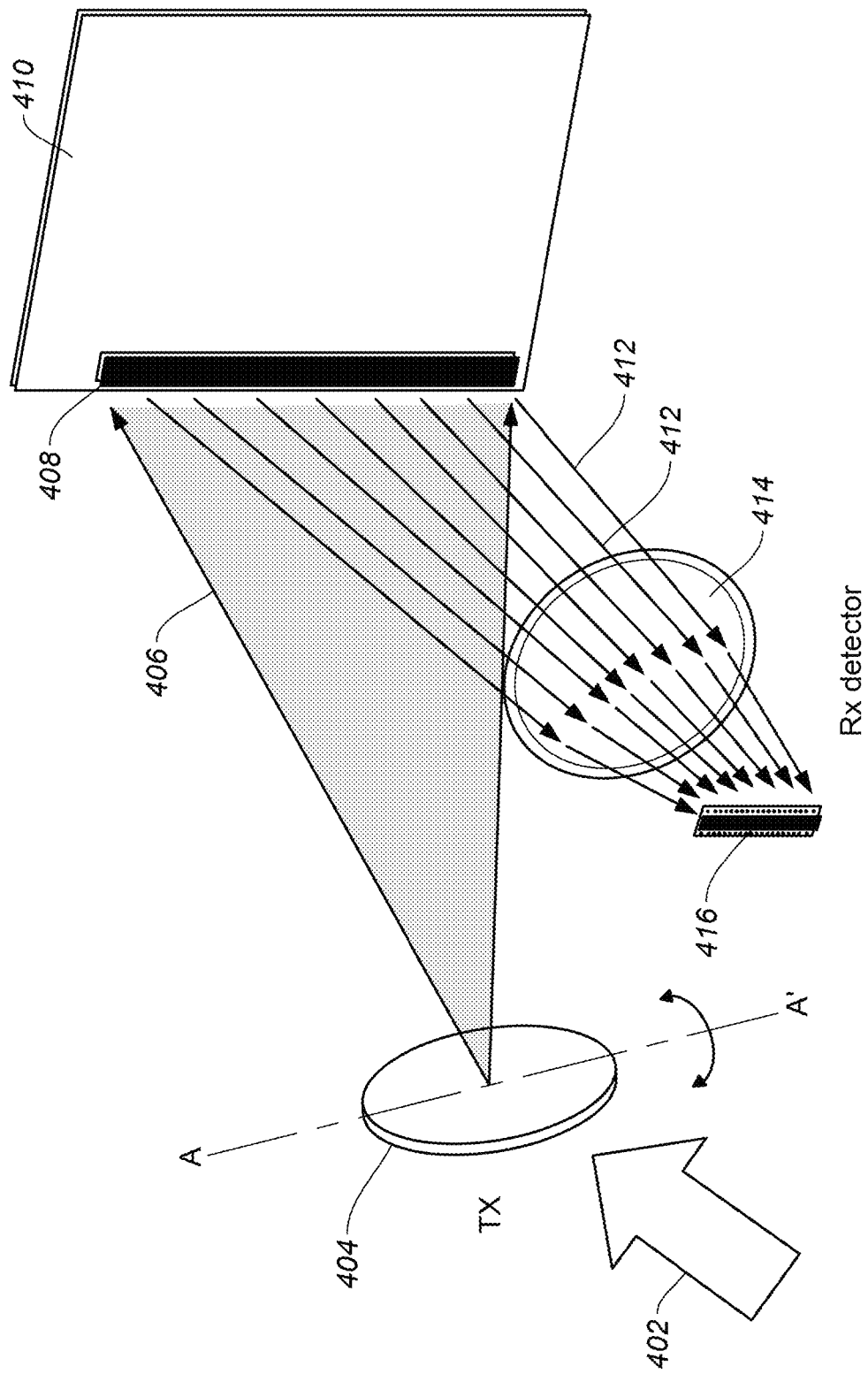
FIG. 4 is a diagram of a prior art MEMS mirror line scanning system with a detector array used in a LiDAR system.

FIG. 4 is a diagram of a prior art MEMS mirror line scanning system with a detector array used in a LiDAR system. Flash LiDAR or scanning flash LiDAR uses a large divergence light output to project onto the field. Larger divergence lifts the bars of maximum power output due to eye safety. As shown in FIG. 4, a laser beam 402 is redirected by a mirror 404 as a diverging beam 406. The diverging beam is directed into the environment 410, impacting along an entire line in the vertical direction 408. Reflected beams 412 from each of the pixels in vertical line 408 are detected by a detector array 416. The received light is focused through a condensing lens 414, onto detector array 416. Thus, a 1-D MEMS mirror delivers the divergence beam in the vertical direction, while scanning in the horizontal direction. This architecture does not require a large array size in the horizontal direction for the detector array. However, the vertical direction pixel amount requirement still remains. Meanwhile, every pixel of the vertical detector array need to be read-out individually, which places a heavy burden of the read-out circuitry. For example, if the vertical field of view is 20 degrees and the angular resolution required is 0.05 degrees, then a 400-channel simultaneous high speed detection circuitry is needed, which is technically extremely difficult to achieve.

Figure 5:
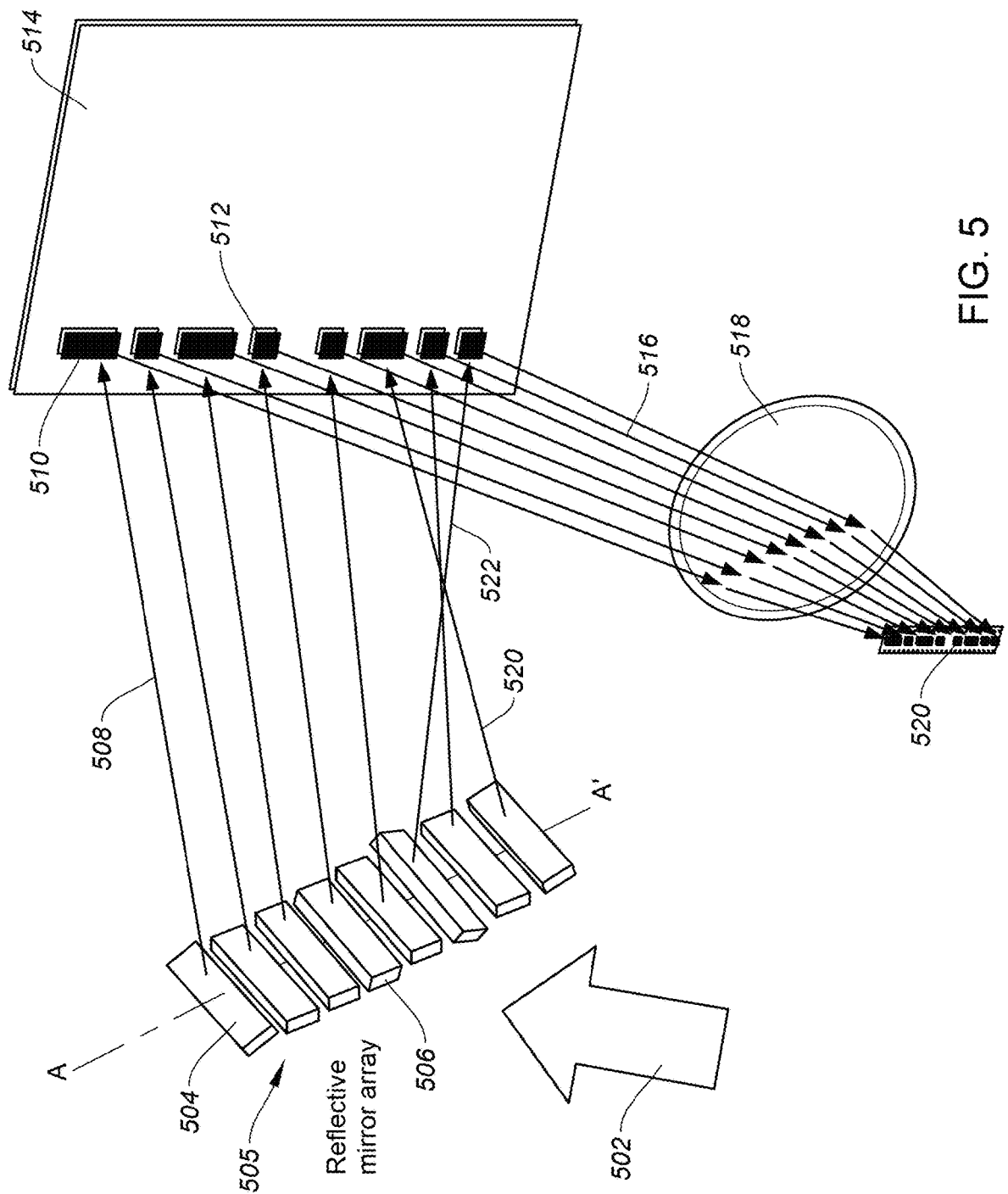
FIG. 5 is a diagram of a reflective MEMS mirror array with tilt angles based on scanning coded-Hadamard-aperture, according to embodiments.

FIG. 5 is a diagram of a reflective MEMS mirror array with tilt angles based on scanning coded-Hadamard-aperture, according to embodiments. FIG. 5 illustrates an architecture that uses a controlled scanning mirror array to project the coded pattern into the field/environment. Different patterns would result in different intensity distribution in the far field, but the total amount of projected energy (summed up) would be the same. Each moment the scanning mirror array is controlled with a design angle for every single element. As shown, a laser beam 502 or a series of laser beams 502 is/are directed to an array 505 of reflective MEMS mirrors, including mirrors 504 and 506. As can be seen, each of the mirrors is at a slightly different angle, projecting beams such as beam 508 onto an environment 514. For example a pixel area 510 is illuminated by a beam reflected by mirror 504, and a pixel area 512 is illuminated by a beam reflected from mirror 506. In the example shown, the beams 520 and 522 of two of the mirrors cross over each other Beams 520 and 522 are an example showing that the pattern sequence in the far field doesn't necessarily need to match that of the mirror array. As long as the final intensity distribution is achieved in the far field, it doesn't matter whether it's 504 or 506 to get the intensity spot of 512, either one could do that. The different size of 510 vs 512 indicates 510 is occupying two pixels as "on." Reflected beams 516 are refocused by a lens 518 onto a detector array 520.

A scanner array is used in FIG. 5. Each mirror element of the scanner array reflects light in a different direction. The amount of light produced is thus reduced compared to the prior art scan line device of FIG. 4, thus reducing the burden on the laser. As can be seen, only some of the pixels in a vertical line are illuminated. Accordingly, the mirror array is repeatedly adjusted to project different Hadamard patterns in the same vertical line, rapidly, one after the other, until every pixel in the vertical line has been illuminated by at least one of the patterns. In addition, every pixel will be illuminated multiple times in order to enable the detection of each pixel from a combined signal as discussed below. Using very fast switching, multiple patterns can be projected on a single vertical line in an acceptable time, with each scan lasting about 1 microsecond in one embodiment. In embodiments of the present invention, instead of illuminating an entire line, such as 200 pixels, a subset of elements in the line is used at separated angles at a single time. An advantage is that the signal level intensity is higher for each position with a reduced number of positions.

The detector array 520 can be a series of individual photodetectors, or can be a single elongated photodetector as will be discussed in more detail below. FIG. 5 shows 8 dots or pixels, but those are repeat for other groups of 8 in the same vertical line at different times to get all 200 in a column in one embodiment. Thereafter, the scanning moves to the next vertical line. Alternately, horizontal lines, or any other angle could be used, and then stepped through the entire environment to be detected. For the photodetectors, in embodiments an Avalanche Photo Diode (APD) could be used for a single detector embodiment, and APDs or Field Effect Transistors (FETs) for a multiple detector embodiment.

The total illumination of all of the reflected pixel laser beams is determined by either summing the detected intensities from an array of detectors or simply using the output of a single detector. Using the Hadamard method, the value of each individual pixel can be decoded from multiple patterns that include each pixel. For an example of this calculation, see "Ultrasound Detection Arrays Via Coded Hadamard Apertures," by Evgeny Hahamovich and Amir Rosenthal, IEEE Xplore, Feb. 27, 2020, the disclosure of which is hereby incorporated herein by reference. FIG. 5 shows a horizontal scanner, but in embodiments a second, vertical scanner is also provided in addition.

Figure 6A:
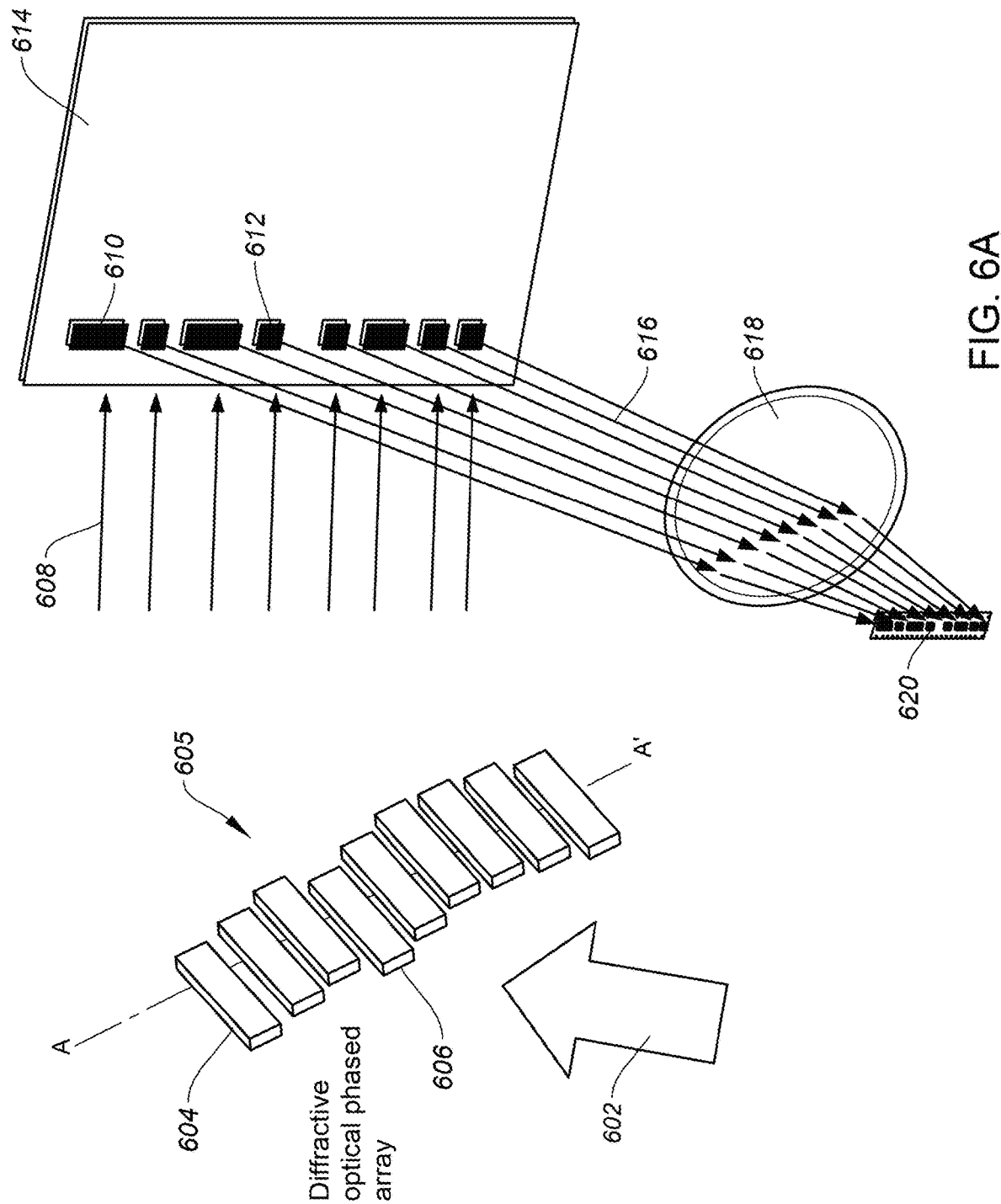
FIG. 6A is a diagram of a reflective MEMS mirror array with vertically displaced mirrors to produce a diffraction based coded-Hadamard-aperture, according to embodiments.

FIG. 6A is a diagram of a reflective MEMS mirror array with vertically displaced mirrors to produce a diffraction based coded-Hadamard-aperture, according to embodiments. FIG. 6A illustrates an architecture that uses a diffractive optical phased array (OPA) that projects an incoming plane wave illumination into a coded pattern through diffraction. Incoming laser light 602 is reflected off an array 605 of MEMS mirrors including mirrors 604 and 606, for example. Each of the mirrors is vertically displaced at a different height. The difference in height of the mirrors results in a diffractive pattern. The difference in height is programmed to be different fractions of the laser wavelength to produce the diffraction pattern. For example, the difference in height can be ¼, ⅛, ¹⁄₁₀, etc. of the wavelength. The difference in height causes a diffraction pattern in the reflected laser beams 608. The diffraction pattern will have a number of nodes that illuminate different pixels, such as a 0 order, +/−$1^{st}$ order, +/−$2^{nd}$ order and +/−$3^{rd}$ order nodes. This diffraction pattern is projected into the environment 614 as a series of pixels in a vertical line such as pixels 610 and 612. The reflected laser beams 616 are focused by a lens 618 onto a photodetector array 620.

The diffraction pattern is a Hadamard coded pattern. Similar to FIG. 5, multiple arrays of reflected laser beams are generated for the same vertical line by multiple vertical positions of the mirrors in the mirror array at different times. Similar to the embodiment of FIG. 5, only some of the pixels in a vertical line are illuminated at any given time. Accordingly, the mirror array is repeatedly adjusted to project different Hadamard patterns in the same vertical line, rapidly, one after the other, until every pixel in the vertical line has been illuminated by at least one of the patterns. In addition, every pixel will be illuminated multiple times in order to enable the detection of each pixel from a combined signal as discussed below. In one embodiment, an array of 8 mirrors is used to cover 200 pixels in a vertical line. Since each pixel will need to be part of multiple patterns to enable decoding, this requires. This requires 50 patterns to be projected on a single vertical line to provide that every pixel is in at least two patterns. At a speed of one microsecond per pattern, this requires 50 microseconds.

In one embodiment, there is an array of 10 mirrors to cover 200 pixels in a vertical line. 20 repetitions in 1 horizontal direction are provided to decode the information of all 200 pixels. Assume the frame rate required for LiDAR is 10 frames per second, The horizontal scanning should at least be 200×10=2000 Hz. Therefore for one MEMS horizontal scan it takes 500 us. Assume we have 1000 vertical lines in one frame, each horizontal direction for a vertical line scanning would take 50 us.

Also, similarly to the embodiment of FIG. 5, the detector array 620 can be a series of individual photodetectors, or can be a single elongated photodetector as will be discussed in more detail below. The total illumination of all of the reflected pixel laser beams is determined by either summing the detected intensities from an array of detectors or simply using the output of a single detector. Using the Hadamard method, the value of each individual pixel can be decoded from multiple patterns that include each pixel.

The Hadamard code is a locally decodable code, which provides a way to recover parts of the original message with high probability, while only looking at a small fraction of the received word. Using list decoding, it is possible to compute a short list of possible candidate messages.

Figure 6B:
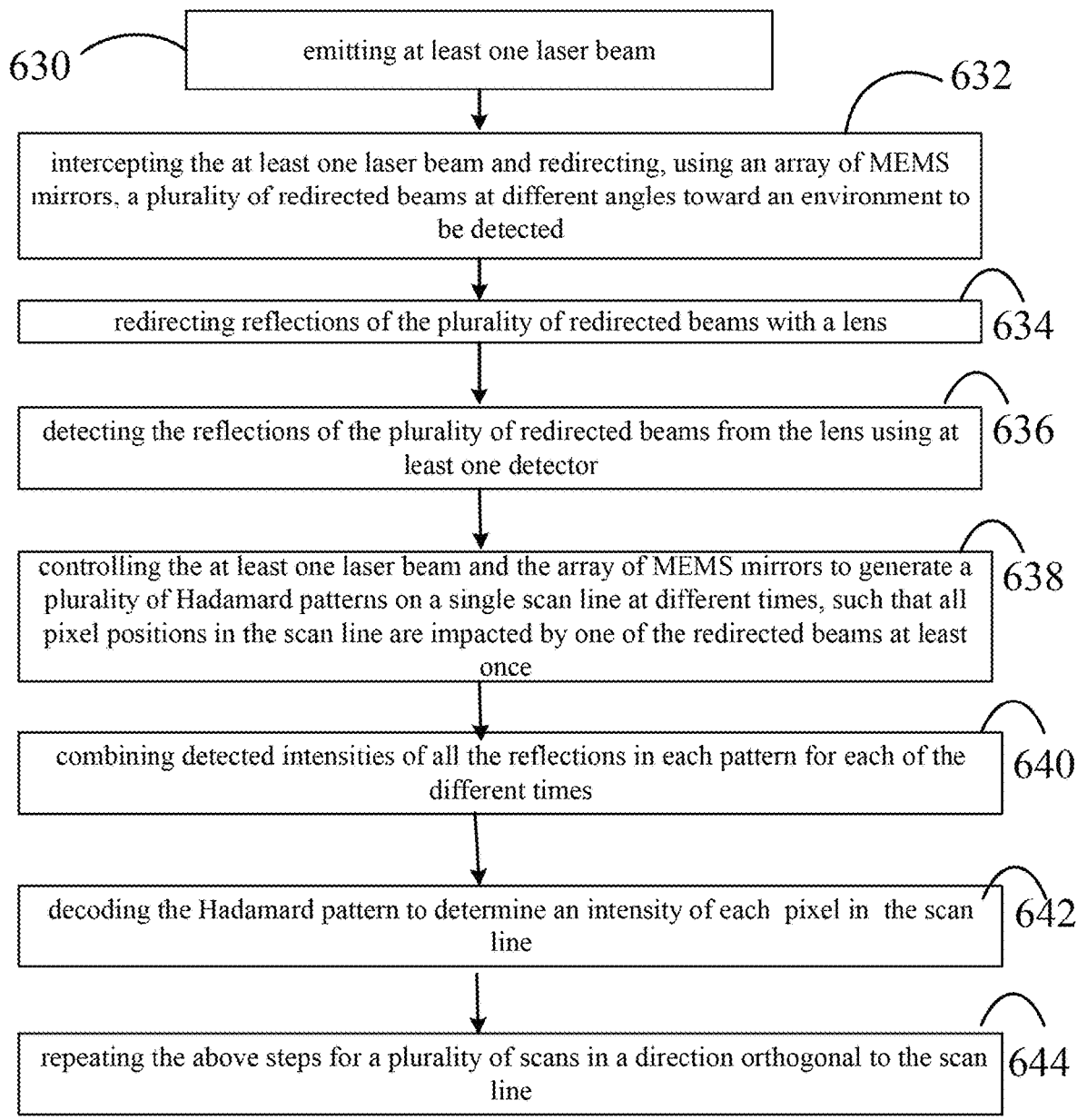
FIG. 6B is a flowchart illustrating the method for beam steering using micro-electromechanical system (MEMS) mirrors shown in FIG. 6A, and also in FIG. 5.

FIG. 6B is a flowchart illustrating the method for beam steering using micro-electromechanical system (MEMS) mirrors shown in FIG. 6A, and also in FIG. 5. Step 630 is emitting at least one laser beam. Step 632 is intercepting the at least one laser beam and redirecting, using an array of MEMS mirrors, a plurality of redirected beams at different angles toward an environment to be detected. Step 634 is redirecting reflections of the plurality of redirected beams with a lens. Step 636 is detecting the reflections of the plurality of redirected beams from the lens using at least one detector. Step 638 is controlling the at least one laser beam and the array of MEMS mirrors to generate a plurality of Hadamard patterns on a single scan line at different times, such that all pixel positions in the scan line are impacted by one of the redirected beams at least once. Step 640 is combining detected intensities of all the reflections in each pattern for each of the different times. Step 642 is decoding the Hadamard pattern to determine an intensity of each pixel in the scan line. Step 644 is repeating the above steps for a plurality of scans in a direction orthogonal to the scan line.

Figure 7A:
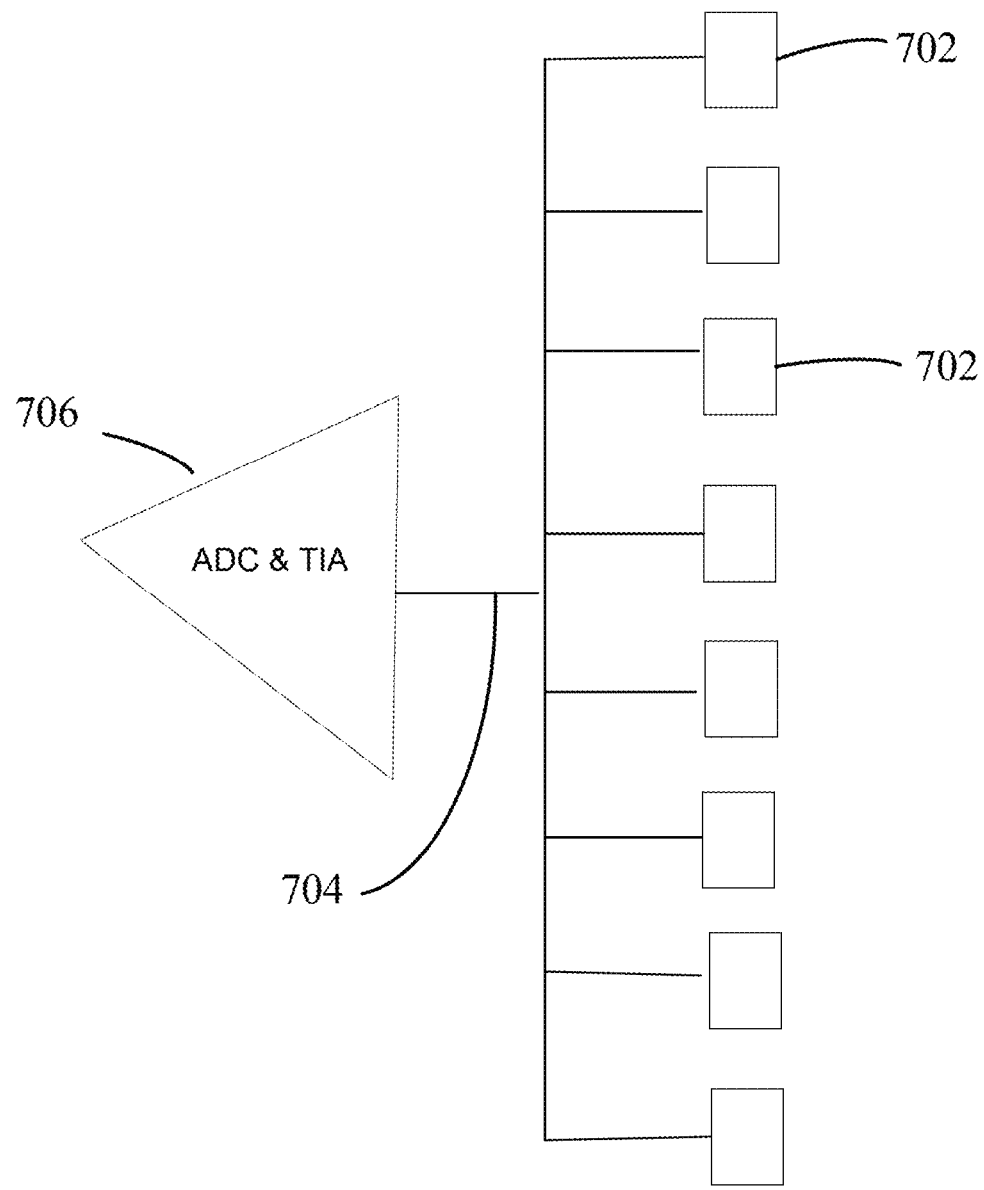
FIGS. 7A and 7B are diagrams of different detector and amplifier elements for the embodiments of FIGS. 5 and 6, according to embodiments.
Figure 7B:
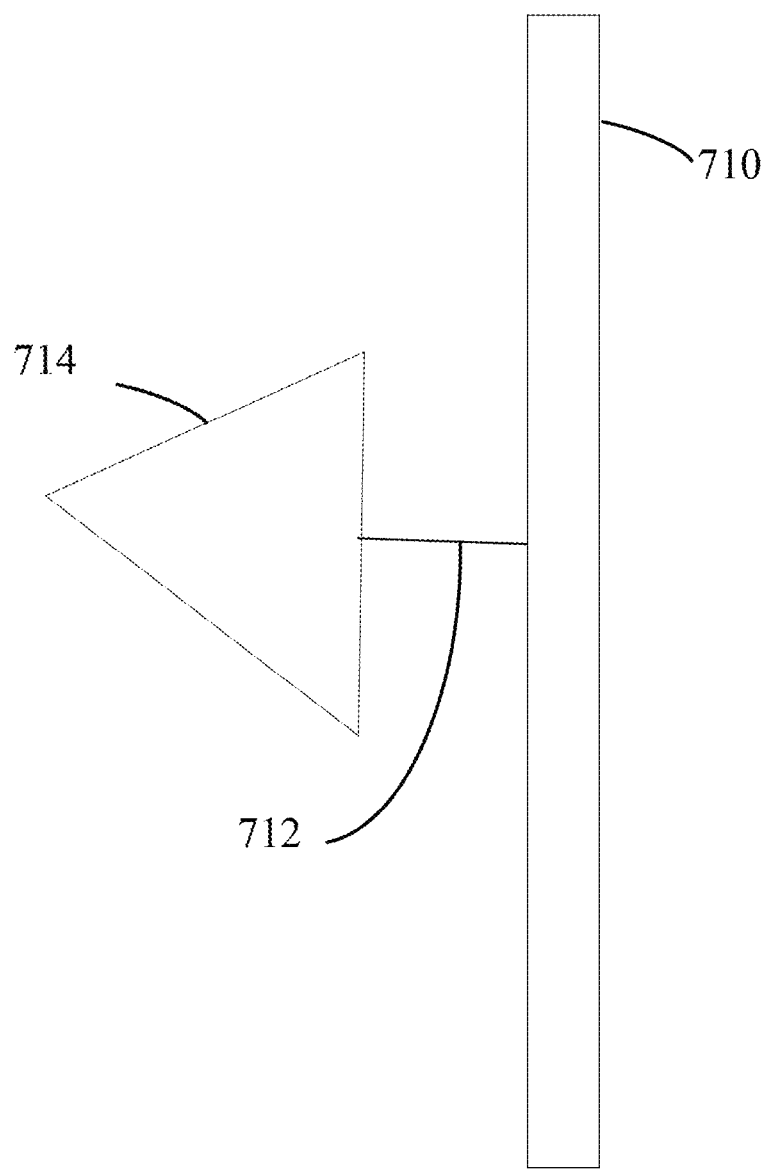

FIGS. 7A and 7B are diagrams of different detector and amplifier elements for the embodiments of FIGS. 5 and 6, according to embodiments. FIG. 7A illustrates an embodiment with an array of photodetectors 702 which have their outputs connected to a single it input 704 of an analog to digital converter (ADC) and trans impedance amplifier (TIA) 706. Thus, the intensities of all of the photodetectors 702 at any particular time are summed to provide a total intensity for a particular Hadamard pattern.

FIG. 7B illustrates an alternate embodiment with a single photodetector 710 which receives the light from a vertical array of reflected beams, and provides a single output 712 connected to an input of an analog to digital converter (ADC) and trans impedance amplifier (TIA) 714. Thus, the intensities of all of the reflected laser beams at any particular time are summed in photodetector 710 to provide a total intensity for a particular Hadamard pattern.

Figure 8A:
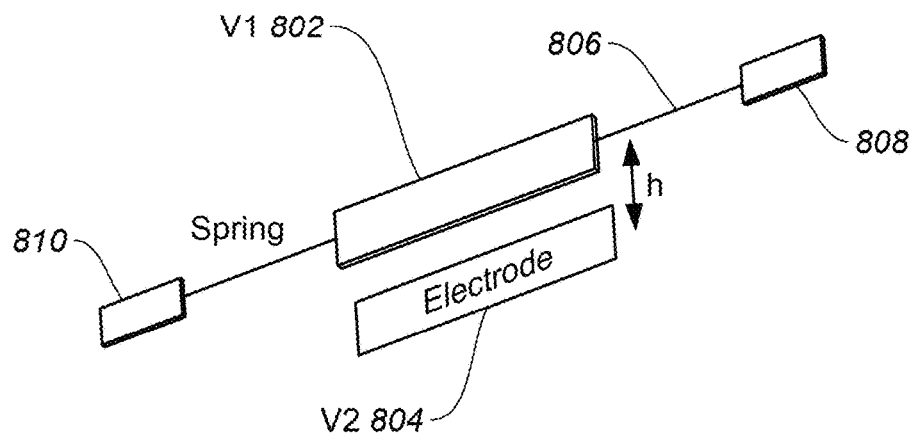
FIGS. 8A and 8B are diagrams of different vertical mirror displacement structures for the embodiment of FIG. 6, according to embodiments.
Figure 8B:
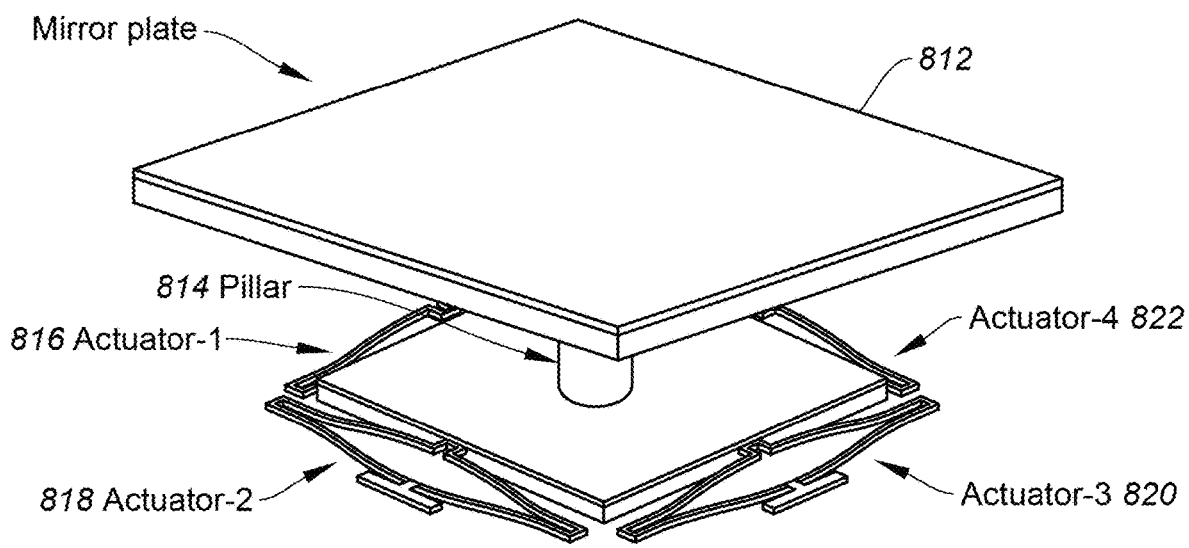

FIGS. 8A and 8B are diagrams of different vertical mirror displacement structures for the embodiment of FIG. 6, according to embodiments.

FIG. 8A is a diagram of a vertical mirror displacement structure for the vertical displacement embodiment of FIG. 6, using an electrostatic force structure, according to embodiments. A mirror 802 is formed above an electrode 804 at a distance of a height h. Mirror 802 is connected to anchors 808 and 810 via a thin structure or spring 806. In operation, a voltage can be applied between mirror 802 and electrode 804, causing an electrostatic force which either separates mirror 802 from electrode 804, causing it to rise vertically, or draws it closer, causing mirror 802 to lower vertically. When a voltage (e.g., 50 volts) is applied, it causes an electrostatic force between the mirror and electrode, which causes separation. The force is proportional to The area of the mirror divided by the distance d between the mirror and electrode (Area/$d^2$). In one design embodiment, the maximum travel distance is ⅓ of the gap, d. In one embodiment, multiple strings can be used to tether the mirror 802 to multiple anchors. In one embodiment, the height difference is a few microns, a fraction of the laser wavelength, in order to cause diffraction.

FIG. 8B is a diagram of a vertical mirror displacement structure for the vertical displacement embodiment of FIG. 6, using an alternate structure with a pillar and electro thermal actuators, according to embodiments. In an embodiment, a method of fabricating a micro mirror can include preparing a silicon-on-insulator (SOI) substrate: fabricating electro thermal actuators on a front side of the SOI substrate; and fabricating a micro mirror plate on a back side of the SOI substrate, wherein an inner silicon region of the SOI substrate is removed except for a region providing a pillar structure interconnecting the plurality of electro thermal actuators and the micro mirror plate. The front side of the SOI substrate can be bonded to an anchor substrate for mechanical support. More details of such a structure can be found in U.S. Pub. No. 20100033788.

Figure 9A:
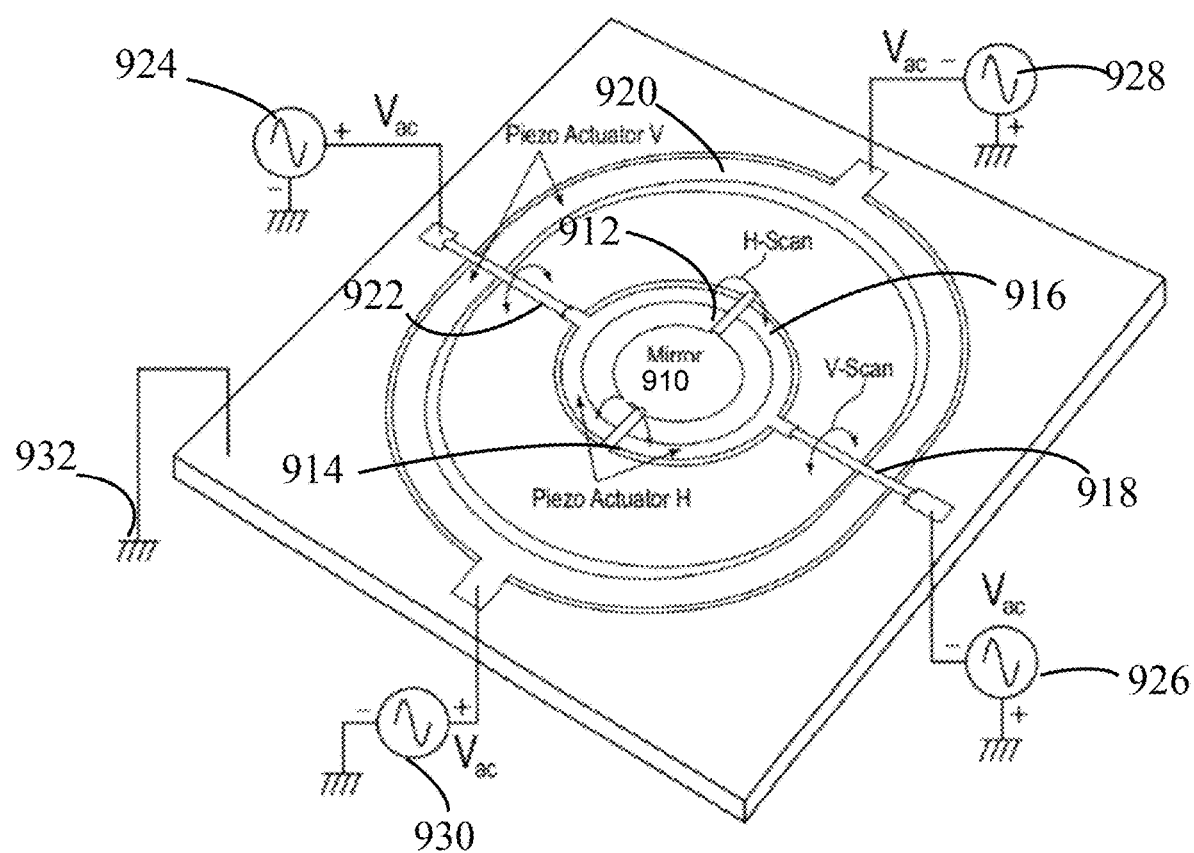
FIG. 9A is a diagram of a reflective MEMS mirror with dual axis rotation, according to embodiments.

FIG. 9A is a diagram of a reflective, piezo MEMS mirror with dual axis rotation, according to embodiments. In this embodiment, the piezo MEMS mirror 910 includes a reflective mirror 910 at its center, which is supported by two orthogonally pivoting axes composed of thin regions 912 and 914 in one direction, and 918 and 922 in another, orthogonal direction. Each of the axes are connected to voltages to bias the mirror at the desired angle, with bias voltages 924, 926 in a first direction, and 928, 930 and a second direction. The substrate is grounded to a ground 932.

Along one axis, Piezo actuator 916 is used, while along the other access, a Piezo actuator 920 is used. The vertical scan and the horizontal scan are controlled via the respective piezoelectric actuators. By applying oscillating electrical voltages to the respective piezoelectric actuators, the mirror is caused to oscillate, thereby causing appropriate scanning.

Figure 9B:
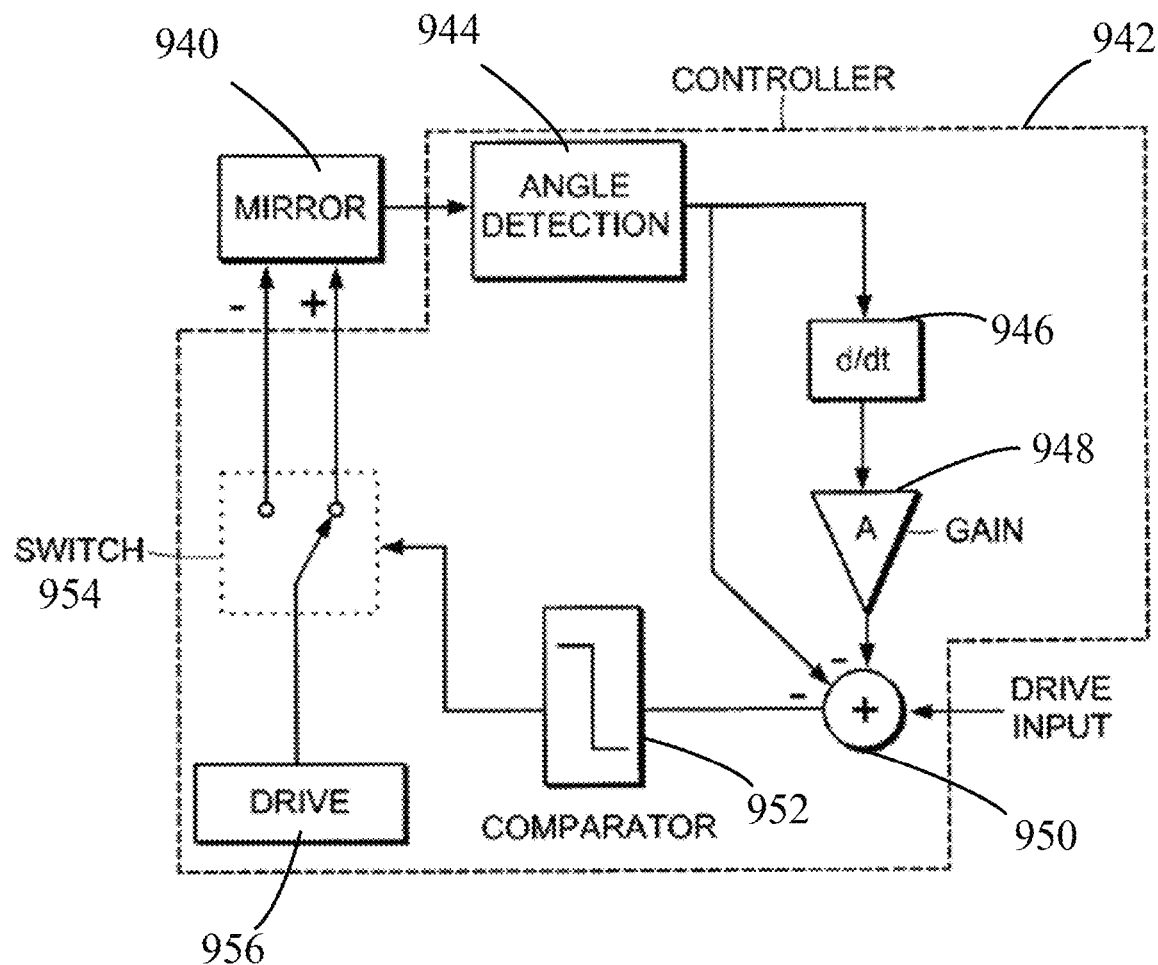
FIG. 9B is a block diagram of a reflective MEMS mirror angle control circuit, according to embodiments.

FIG. 9B is a block diagram of a reflective MEMS mirror angle control circuit, according to embodiments. FIG. 9B shows the block diagram of the micro mirror servo system for a single axis of rotation. The angle of a mirror 940 is detected by an angle detector 944, such as by detecting a change in capacitance as the mirror rotates in a manner known by those of skill in the art. Angle detector 944 is part of a controller 942 which also includes a differentiator circuit 946 and amplifier 948, the output of which is provided to a summing circuit 950. Summing circuit 950 receives a drive input and provides it to a comparator 952 which compares the desired angle to the measured angle and provides an appropriate input to a switch 954. The switch connects a drive current 956 between different positions to drive the angle of mirror 940 to either a more positive or more negative angle. A understood by those skilled in the art, multiple loops using the same scheme of FIG. 9B can be used to control multiple axes of rotation. For example, a gimbaled structure with a mirror which is located within an outer frame, such as shown in FIG. 9A, would require a double loop architecture.

In summary, in one embodiment, a micro-electromechanical system (MEMS) apparatus for beam steering in a Light Detection and Ranging (LiDAR) system of an autonomous vehicle is provided. The apparatus comprises the following elements:

- at least one laser 208 for emitting at least one laser beam 502;
- an array 505 of MEMS mirrors each having a reflective surface for intercepting the at least one laser beam and redirecting it toward an environment 514 to be detected;
- at least one detector 520 for detecting at least one reflected beam 516 of the at least one laser beam; and
- a controller 206 configured to control the at least one laser and the array of MEMS mirrors to generate a plurality of irregular patterns.

In one embodiment the irregular pattern is a Hadamard pattern.

In one embodiment the plurality of mirrors are tilted at a plurality of angles to form the irregular pattern. In one embodiment the plurality of mirrors are biased at different heights to form the irregular pattern with a diffractive pattern. In one embodiment the controller is further programmed to combine a detected intensity of multiple irregular patterns from the at least one detector for multiple times for a single scan line, and to determine values of intensities for each pixel in the scan line from analysis of multiple irregular patterns and the detected intensity of the multiple irregular patterns.

Example LiDAR System Implementing Aspects of Embodiments Herein

Figure 10:
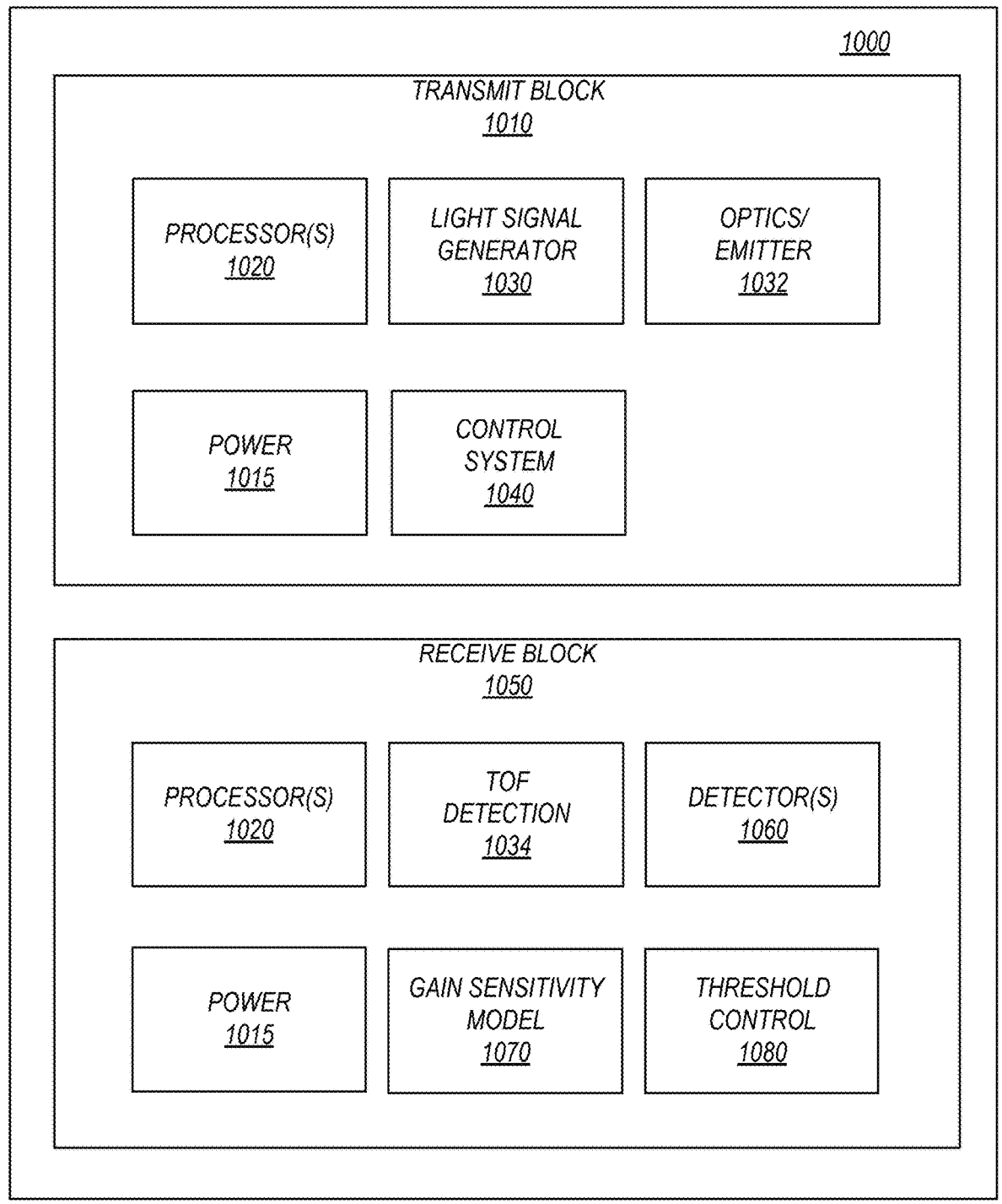
FIG. 10 illustrates a simplified block diagram showing aspects of a LiDAR-based detection system, according to certain embodiments of the invention.

FIG. 10 illustrates a simplified block diagram showing aspects of a LiDAR-based detection system 1000, according to certain embodiments. System 1000 may be configured to transmit, detect, and process LiDAR signals to perform object detection as described above with regard to LiDAR system 100 described in FIG. 1. In general, a LiDAR system 1000 includes one or more transmitters (e.g., transmit block 1010) and one or more receivers (e.g., receive block 1050). LiDAR system 1000 may further include additional systems that are not shown or described to prevent obfuscation of the novel features described herein.

Transmit block 1010, as described above, can incorporate a number of systems that facilitate that generation and emission of a light signal, including dispersion patterns (e.g., 360 degree planar detection), pulse shaping and frequency control, Time-Of-Flight (TOF) measurements, and any other control systems to enable the LiDAR system to emit pulses in the manner described above. In the simplified representation of FIG. 10, transmit block 1010 can include processor(s) 1020, light signal generator 1030, optics/emitter module 1032, power block 1015 and control system 1040. Some of all of system blocks 1020-1040 can be in electrical communication with processor(s) 1020.

In certain embodiments, processor(s) 1020 may include one or more microprocessors (µCs) and can be configured to control the operation of system 1000. Alternatively or additionally, processor 1020 may include one or more microcontrollers (MCUs), digital signal processors (DSPs), or the like, with supporting hardware, firmware (e.g., memory, programmable I/Os, etc.), and/or software, as would be appreciated by one of ordinary skill in the art. Alternatively, MCUs, µCs, DSPs, ASIC, programmable logic device, and the like, may be configured in other system blocks of system 1000. For example, control system block 1040 may include a local processor to certain control parameters (e.g., operation of the emitter). Processor(s) 1020 may control some or all aspects of transmit block 1010 (e.g., optics/emitter 1032, control system 1040, dual sided mirror 220 position as shown in FIG. 1, position sensitive device 250, etc.), receive block 1050 (e.g., processor(s) 1020) or any aspects of LiDAR system 1000. In some embodiments, multiple processors may enable increased performance characteristics in system 1000 (e.g., speed and bandwidth), however multiple processors are not required, nor necessarily germane to the novelty of the embodiments described herein. Alternatively or additionally, certain aspects of processing can be performed by analog electronic design, as would be understood by one of ordinary skill in the art.

Light signal generator 1030 may include circuitry (e.g., a laser diode) configured to generate a light signal, which can be used as the LiDAR send signal, according to certain embodiments. In some cases, light signal generator 1030 may generate a laser that is used to generate a continuous or pulsed laser beam at any suitable electromagnetic wavelengths spanning the visible light spectrum and non-visible light spectrum (e.g., ultraviolet and infra-red). In some embodiments, lasers are commonly in the range of 600-1200 nm, although other wavelengths are possible, as would be appreciated by one of ordinary skill in the art.

Optics/Emitter block 1032 (also referred to as transmitter 1032) may include one or more arrays of mirrors (including but not limited to dual sided mirror 220 as described above in FIGS. 1-6) for redirecting and/or aiming the emitted laser pulse, mechanical structures to control spinning and/or moving of the emitter system, or other system to affect the system field-of-view, as would be appreciated by one of ordinary skill in the art with the benefit of this disclosure. For instance, some systems may incorporate a beam expander (e.g., convex lens system) in the emitter block that can help reduce beam divergence and increase the beam diameter. These improved performance characteristics may mitigate background return scatter that may add noise to the return signal. In some cases, optics/emitter block 1032 may include a beam splitter to divert and sample a portion of the pulsed signal. For instance, the sampled signal may be used to initiate the TOF clock. In some cases, the sample can be used as a reference to compare with backscatter signals. Some embodiments may employ micro electromechanical mirrors (MEMS) that can reorient light to a target field. Alternatively or additionally, multi-phased arrays of lasers may be used. Any suitable system may be used to emit the LiDAR send pulses, as would be appreciated by one of ordinary skill in the art.

Power block 1015 can be configured to generate power for transmit block 1010, receive block 1050, as well as manage power distribution, charging, power efficiency, and the like. In some embodiments, power management block 1015 can include a battery (not shown), and a power grid within system 1000 to provide power to each subsystem (e.g., control system 1040, etc.). The functions provided by power management block 1015 may be subsumed by other elements within transmit block 1010, or may provide power to any system in LiDAR system 1000. Alternatively, some embodiments may not include a dedicated power block and power may be supplied by a number of individual sources that may be independent of one another.

Control system 1040 may control aspects of light signal generation (e.g., pulse shaping), optics/emitter control, TOF timing, or any other function described herein. In some cases, aspects of control system 1040 may be subsumed by processor(s) 1020, light signal generator 1030, or any block within transmit block 1010, or LiDAR system 1000 in general.

Receive block 1050 may include circuitry configured to detect a process a return light pulse to determine a distance of an object, and in some cases determine the dimensions of the object, the velocity and/or acceleration of the object, and the like. Processor(s) 1065 may be configured to perform operations such as processing received return pulses from detectors(s) 1060, controlling the operation of TOF module 1034, controlling threshold control module 1080, or any other aspect of the functions of receive block 1050 or LiDAR system 1000 in general.

TOF module 1034 may include a counter for measuring the time-of-flight of a round trip for a send and return signal. In some cases, TOF module 1034 may be subsumed by other modules in LiDAR system 1000, such as control system 1040, optics/emitter 1032, or other entity. TOF modules 1034 may implement return "windows" that limit a time that LiDAR system 1000 looks for a particular pulse to be returned. For example, a return window may be limited to a maximum amount of time it would take a pulse to return from a maximum range location (e.g., 250 m). Some embodiments may incorporate a buffer time (e.g., maximum time plus 10%). TOF module 1034 may operate independently or may be controlled by other system block, such as processor(s) 1020, as described above. In some embodiments, transmit block may also include a TOF detection module. One of ordinary skill in the art with the benefit of this disclosure would appreciate the many modification, variations, and alternative ways of implementing the TOF detection block in system 1000.

Detector(s) 1060 may detect incoming return signals that have reflected off of one or more objects. In some cases, LiDAR system 1000 may employ spectral filtering based on wavelength, polarization, and/or range to help reduce interference, filter unwanted frequencies, or other deleterious signals that may be detected. Typically, detector(s) 1060 can detect an intensity of light and records data about the return signal (e.g., via coherent detection, photon counting, analog signal detection, or the like). Detector (s) 1060 can use any suitable photodetector technology including solid state photodetectors (e.g., silicon avalanche photodiodes, complimentary metal-oxide semiconductors (CMOS), charge-coupled devices (CCD), hybrid CMOS/CCD devices) or photomultipliers. In some cases, a single receiver may be used or multiple receivers may be configured to operate in parallel.

Gain sensitivity model 1070 may include systems and/or algorithms for determining a gain sensitivity profile that can be adapted to a particular object detection threshold. The gain sensitivity profile can be modified based on a distance (range value) of a detected object (e.g., based on TOF measurements). In some cases, the gain profile may cause an object detection threshold to change at a rate that is inversely proportional with respect to a magnitude of the object range value. A gain sensitivity profile may be generated by hardware/software/firmware, or gain sensor model 1070 may employ one or more look up tables (e.g., stored in a local or remote database) that can associate a gain value with a particular detected distance or associate an appropriate mathematical relationship there between (e.g., apply a particular gain at a detected object distance that is 10% of a maximum range of the LiDAR system, apply a different gain at 15% of the maximum range, etc.). In some cases, a Lambertian model may be used to apply a gain sensitivity profile to an object detection threshold. The Lambertian model typically represents perfectly diffuse (matte) surfaces by a constant bidirectional reflectance distribution function (BRDF), which provides reliable results in LiDAR system as described herein. However, any suitable gain sensitivity profile can be used including, but not limited to, Oren-Nayar model, Nanrahan-Krueger, Cook-Torrence, Diffuse BRDF, Limmel-Seeliger, Blinn-Phong, Ward model, HTSG model, Fitted Lafortune Model, or the like. One of ordinary skill in the art with the benefit of this disclosure would understand the many alternatives, modifications, and applications thereof.

Threshold control block 1080 may set an object detection threshold for LiDAR system 1000. For example, threshold control block 1080 may set an object detection threshold over a certain a full range of detection for LiDAR system 1000. The object detection threshold may be determined based on a number of factors including, but not limited to, noise data (e.g., detected by one or more microphones) corresponding to an ambient noise level, and false positive data (typically a constant value) corresponding to a rate of false positive object detection occurrences for the LiDAR system. In some embodiments, the object detection threshold may be applied to the maximum range (furthest detectable distance) with the object detection threshold for distances ranging from the minimum detection range up to the maximum range being modified by a gain sensitivity model (e.g., Lambertian model).

Although certain systems may not expressly discussed, they should be considered as part of system 1000, as would be understood by one of ordinary skill in the art. For example, system 1000 may include a bus system (e.g., CAMBUS) to transfer power and/or data to and from the different systems therein. In some embodiments, system 1000 may include a storage subsystem (not shown). A storage subsystem can store one or more software programs to be executed by processors (e.g., in processor(s) 1020). It should be understood that "software" can refer to sequences of instructions that, when executed by processing unit(s) (e.g., processors, processing devices, etc.), cause system 1000 to perform certain operations of software programs. The instructions can be stored as firmware residing in read only memory (ROM) and/or applications stored in media storage that can be read into memory for processing by processing devices. Software can be implemented as a single program or a collection of separate programs and can be stored in non-volatile storage and copied in whole or in-part to volatile working memory during program execution. From a storage subsystem, processing devices can retrieve program instructions to execute in order to execute various operations (e.g., software-controlled spring auto-adjustment, etc.) as described herein. Some software controlled aspects of LiDAR system 1000 may include aspects of gain sensitivity model 1070, threshold control 1080, control system 1040, TOF module 1034, or any other aspect of LiDAR system 1000.

It should be appreciated that system 1000 is meant to be illustrative and that many variations and modifications are possible, as would be appreciated by one of ordinary skill in the art. System 1000 can include other functions or capabilities that are not specifically described here. For example, LiDAR system 1000 may include a communications block (not shown) configured to enable communication between LiDAR system 1000 and other systems of the vehicle or remote resource (e.g., remote servers), etc., according to certain embodiments. In such cases, the communications block can be configured to provide wireless connectivity in any suitable communication protocol (e.g., radio-frequency (RF), Bluetooth, BLE, infra-red (IR), ZigBee, Z-Wave, Wi-Fi, or a combination thereof).

While system 1000 is described with reference to particular blocks (e.g., threshold control block 1080), it is to be understood that these blocks are defined for understanding certain embodiments of the invention and is not intended to imply that embodiments are limited to a particular physical arrangement of component parts. The individual blocks need not correspond to physically distinct components. Blocks can be configured to perform various operations, e.g., by programming a processor or providing appropriate processes, and various blocks may or may not be reconfigurable depending on how the initial configuration is obtained. Certain embodiments can be realized in a variety of apparatuses including electronic devices implemented using any combination of circuitry and software. Furthermore, aspects and/or portions of system 1000 may be combined with or operated by other sub-systems as informed by design. For example, power management block 1015 and/or threshold control block 1080 may be integrated with processor(s) 1020 instead of functioning as separate entities.

Example Computer Systems Implementing Aspects of Embodiments Herein

Figure 11:
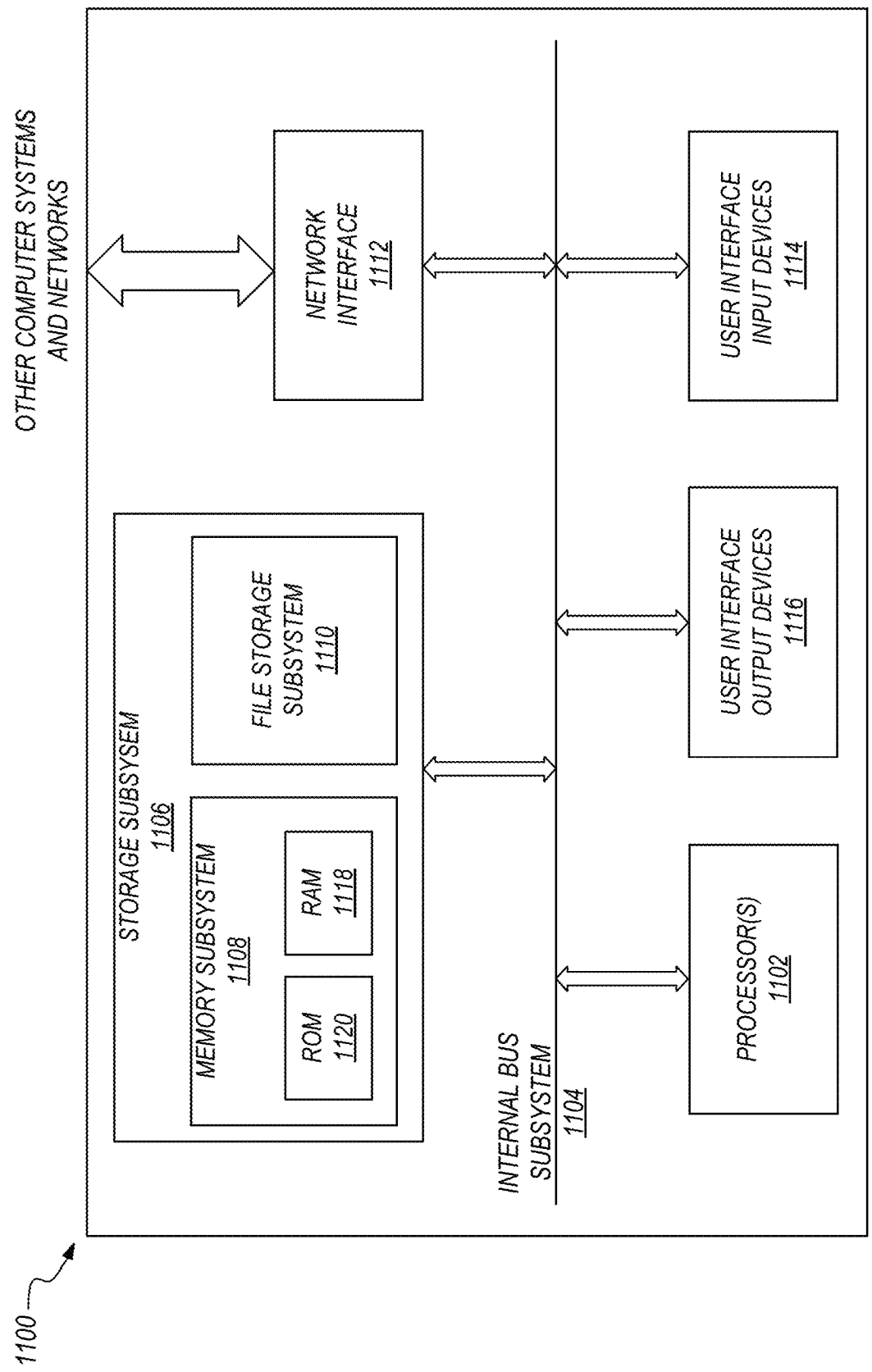
FIG. 11 illustrates an example computer system that may be utilized to implement techniques disclosed herein, according to certain embodiments of the invention.

FIG. 11 is a simplified block diagram of computer system 1100 configured to operate aspects of a LiDAR-based detection system, according to certain embodiments. Computer system 1100 can be used to implement any of the systems and modules discussed above with respect to FIGS. 1-6. For example, computer system 1100 may operate aspects of threshold control 1080, TOF module 1034, processor(s) 1020, control system 1040, or any other element of LiDAR system 1000 or other system described herein. Computer system 1100 can include one or more processors 1102 that can communicate with a number of peripheral devices (e.g., input devices) via a bus subsystem 1104. These peripheral devices can include storage subsystem 1106 (comprising memory subsystem 1108 and file storage subsystem 1110), user interface input devices 1114, user interface output devices 1116, and a network interface subsystem 1112.

In some examples, internal bus subsystem 1104 (e.g., CAMBUS) can provide a mechanism for letting the various components and subsystems of computer system 1100 communicate with each other as intended. Although internal bus subsystem 1104 is shown schematically as a single bus, alternative embodiments of the bus subsystem can utilize multiple buses. Additionally, network interface subsystem 1112 can serve as an interface for communicating data between computer system 1100 and other computer systems or networks. Embodiments of network interface subsystem 1112 can include wired interfaces (e.g., Ethernet, CAN, RS232, RS485, etc.) or wireless interfaces (e.g., ZigBee, Wi-Fi, cellular, etc.).

In some cases, user interface input devices 1114 can include a keyboard, pointing devices (e.g., mouse, trackball, touchpad, etc.), a barcode scanner, a touch-screen incorporated into a display, audio input devices (e.g., voice recognition systems, microphones, etc.), Human Machine Interfaces (HMI) and other types of input devices. In general, use of the term "input device" is intended to include all possible types of devices and mechanisms for inputting information into computer system 1100. Additionally, user interface output devices 1116 can include a display subsystem, a printer, or non-visual displays such as audio output devices, etc. The display subsystem can be any known type of display device. In general, use of the term "output device" is intended to include all possible types of devices and mechanisms for outputting information from computer system 1100.

Storage subsystem 1106 can include memory subsystem 1108 and file/disk storage subsystem 1110. Subsystems 1108 and 1110 represent non-transitory computer-readable storage media that can store program code and/or data that provide the functionality of embodiments of the present disclosure. In some embodiments, memory subsystem 1108 can include a number of memories including main random access memory (RAM) 1118 for storage of instructions and data during program execution and read-only memory (ROM) 1120 in which fixed instructions may be stored. File storage subsystem 1110 can provide persistent (i.e., non-volatile) storage for program and data files, and can include a magnetic or solid-state hard disk drive, an optical drive along with associated removable media (e.g., CD-ROM, DVD, Blu-Ray, etc.), a removable flash memory-based drive or card, and/or other types of storage media known in the art.

It should be appreciated that computer system 1100 is illustrative and not intended to limit embodiments of the present disclosure. Many other configurations having more or fewer components than system 1100 are possible.

The various embodiments further can be implemented in a wide variety of operating environments, which in some cases can include one or more user computers, computing devices or processing devices, which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system also can include a number of workstations running any of a variety of commercially available operating systems and other known applications for purposes such as development and database management. These devices also can include other electronic devices, such as dummy terminals, thin-clients, gaming systems and other devices capable of communicating via a network.

Most embodiments utilize at least one network that would be familiar to those skilled in the art for supporting communications using any of a variety of commercially available protocols, such as TCP/IP, UDP, OSI, FTP, UPnP, NFS, CIFS, and the like. The network can be, for example, a local-area network, a wide-area network, a virtual private network, the Internet, an intranet, an extranet, a public switched telephone network, an infrared network, a wireless network, and any combination thereof.

In embodiments utilizing a network server, the network server can run any of a variety of server or mid-tier applications, including HTTP servers, FTP servers, CGI servers, data servers, Java servers, and business application servers. The server(s) also may be capable of executing programs or scripts in response to requests from user devices, such as by executing one or more applications that may be implemented as one or more scripts or programs written in any programming language, including but not limited to Java®, C, C# or C++, or any scripting language, such as Perl, Python or TCL, as well as combinations thereof. The server(s) may also include database servers, including without limitation those commercially available from Oracle®, Microsoft®, Sybase®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch screen or keypad), and at least one output device (e.g., a display device, printer or speaker). Such a system may also include one or more storage devices, such as disk drives, optical storage devices, and solid-state storage devices such as RAM or ROM, as well as removable media devices, memory cards, flash cards, etc.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a non-transitory computer readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services or other elements located within at least one working memory device, including an operating system and application programs, such as a client application or browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Non-transitory storage media and computer-readable storage media for containing code, or portions of code, can include any appropriate media known or used in the art such as, but not limited to, volatile and non-volatile, removable and non-removable media implemented in any method or technology for storage of information such as computer-readable instructions, data structures, program modules or other data, including RAM, ROM, Electrically Erasable Programmable Read-Only Memory (EEPROM), flash memory or other memory technology, CD-ROM, DVD or other optical storage, magnetic cassettes, magnetic tape, magnetic disk storage or other magnetic storage devices or any other medium which can be used to store the desired information and which can be accessed by a system device. Based on the disclosure and teachings provided herein, a person of ordinary skill in the art will appreciate other ways and/or methods to implement the various embodiments. However, computer-readable storage media does not include transitory media such as carrier waves or the like.

Other variations are within the spirit of the present disclosure. Thus, while the disclosed techniques are susceptible to various modifications and alternative constructions, certain illustrated examples thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims. For instance, any of the examples, alternative examples, etc., and the concepts thereof may be applied to any other examples described and/or within the spirit and scope of the disclosure.

For example, instead of using a single laser to illuminate the array of MEMS mirrors, an array of mirrors may be used. Also, the pattern generation and decoding could be hardwired, in firmware or in software in different embodiments.

The MEMS mirror structure of the present invention can be used in a variety of other applications than LIDAR. Light beam steering techniques can also be used in other optical systems, such as optical display systems (e.g., TVs), optical sensing systems, optical imaging systems, and the like. In various light beam steering systems, the light beam may be steered by, for example, a rotating platform driven by a motor, a multi-dimensional mechanical stage, a Galvo-controlled mirror, a resonant fiber, an array of microelectromechanical (MEMS) mirrors, or any combination thereof. A MEMS micro-mirror may be rotated around a pivot or connection point by, for example, a micro-motor, an electromagnetic actuator, an electrostatic actuator, or a piezoelectric actuator.

The MEMS mirror structure of the present invention can have the mirror mass driven by different types of actuators. In some light steering systems, the transmitted or received light beam may be steered by an array of micro-mirrors. Each micro-mirror may rotate around a pivot or connection point to deflect light incident on the micro-mirror to desired directions. The performance of the micro-mirrors may directly affect the performance of the light steering system, such as the field of view (FOV), the quality of the point cloud, and the quality of the image generated using a light steering system. For example, to increase the detection range and the FOV of a LiDAR system, micro-mirrors with large rotation angles and large apertures may be used, which may cause an increase in the maximum displacement and the moment of inertia of the micro-mirrors. To achieve a high resolution, a device with a high resonant frequency may be used, which may be achieved using a rotating structure with a high stiffness. It may be difficult to achieve this desired performance using electrostatic actuated micro-mirrors because comb fingers used in an electrostatic-actuated micro-mirror may not be able to provide the force and moment needed and may disengage at large rotation angles, in particular, when the aperture of the micro-mirror is increased to improve the detection range. Some piezoelectric actuators may be used to achieve large displacements and large scanning angles due to their ability to provide a substantially larger drive force than electrostatic-actuated types, with a relatively lower voltage.

The use of the terms "a" and "an" and "the" and similar referents in the context of describing the disclosed examples (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. The phrase "based on" should be understood to be open-ended, and not limiting in any way, and is intended to be interpreted or otherwise read as "based at least in part on," where appropriate. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate examples of the disclosure and does not pose a limitation on the scope of the disclosure unless otherwise claimed. No language in the specification should be construed as indicating any non-claimed element as essential to the practice of the disclosure.

What is claimed is:

1. A method for beam steering using micro-electromechanical system (MEMS) mirrors in a Light Detection and Ranging (LiDAR) system of an autonomous vehicle, the method comprising:
   emitting a diverging laser beam;
   intercepting the diverging laser beam and redirecting, using an array of MEMS mirrors, a plurality of redirected beams at different angles toward an environment to be detected;
   redirecting reflections of the plurality of redirected beams with a lens;
   detecting the reflections of the plurality of redirected beams from the lens using a detector;
   controlling the diverging laser beam and the array of MEMS mirrors to generate a plurality of Hadamard patterns on a single scan line at different times, such that all pixel positions in the scan line are impacted by one of the redirected beams at least once;
   combining detected intensities of all the reflections in each pattern for each of the different times to produce a total summation of all of the reflections of each pattern;
   decoding the Hadamard pattern to determine an intensity of each pixel in the scan line; and
   repeating the above steps for a plurality of scans in a direction orthogonal to the scan line.

2. The method of claim 1 further comprising tilting the plurality of mirrors at a plurality of angles to form the Hadamard patterns.

3. The method of claim 1 further comprising biasing the plurality of mirrors at different heights to form the Hadamard patterns with a diffractive pattern.

4. The method of claim 3 wherein the differences in heights of the mirrors are fractions of a wavelength of the diverging laser beam.

5. The method of claim 1 wherein the detector comprises a single detector.

6. A micro-electromechanical system (MEMS) apparatus for beam steering in a Light Detection and Ranging (LiDAR) system of an autonomous vehicle, the apparatus comprising:
   a laser for emitting a diverging laser beam;
   an array of MEMS mirrors each having a reflective surface for intercepting the diverging laser beam and redirecting it toward an environment to be detected;
   a detector for detecting a reflected beam of the diverging laser beam; and
   a controller configured to control the laser and the array of MEMS mirrors to generate a plurality of irregular patterns and transmit them at multiple separate times for a single scan line, such that all pixel positions in the scan line are impacted by the diverging laser beam at least once,
   wherein the controller is further programmed to combine a detected intensity of multiple irregular patterns from the detector for the multiple separate times for a single scan line to produce a total summation of all of the reflections of each irregular pattern, and to determine values of intensities for each pixel in the scan line from analysis of the multiple irregular patterns and the detected intensity of the multiple irregular patterns.

7. The apparatus of claim 6 wherein the irregular pattern is a Hadamard pattern.

8. The apparatus of claim 6 wherein the plurality of mirrors is tilted at a plurality of angles to form the irregular pattern.

9. The apparatus of claim 6 wherein the plurality of mirrors is biased at different heights to form the irregular pattern with a diffractive pattern.

10. The apparatus of claim 6 wherein the detector comprises a plurality of detectors, and further comprising:
    a trans impedance amplifier (TIA) having a single input coupled to outputs of all of the plurality of detectors; and
    a single analog to digital converter (ADC) coupled to an output of the TIA.

11. The apparatus of claim 6 wherein the detector comprises a single detector.

12. The apparatus of claim 6 further comprising a lens positioned to focus the reflected beam on the detector.

13. The apparatus of claim 6 wherein the controller is configured to sequentially produce multiple, different irregular patterns illuminating different combinations of pixels in a single scan line.

14. The apparatus of claim 6 wherein at least one of the irregular patterns includes adjacent pixels illuminated by separate ones of the MEMS mirrors.

15. A micro-electromechanical system (MEMS) apparatus for beam steering in a Light Detection and Ranging (LiDAR) system of an autonomous vehicle, the apparatus comprising:
    a laser for emitting a diverging laser beam;
    an array of MEMS mirrors each having a reflective surface for intercepting the diverging laser beam and redirecting a plurality of redirected beams at different angles toward an environment to be detected;
    a lens for redirecting reflections of the plurality of redirected beams;

a detector for detecting the reflections of the plurality of redirected beams from the lens;

a trans impedance amplifier (TIA) having a single input coupled to an output of the detector;

a single analog to digital converter (ADC) coupled to an output of the TIA; and a controller configured to:
  (a) control the diverging laser and the array of MEMS mirrors to generate a plurality of Hadamard patterns on a single scan line at different times, such that all pixel positions in the scan line are impacted by one of the redirected beams at least once,
  (b) combine detected intensities of all the reflections in each pattern for each of the different times to produce a total summation of all of the reflections of each pattern;
  (c) decode the Hadamard pattern to determine an intensity of each pixel in the scan line, and
  (d) repeat a-c for a plurality of scans in a direction orthogonal to the scan line.

16. The apparatus of claim 15 wherein the plurality of mirrors is tilted at a plurality of angles to form the Hadamard patterns.

17. The apparatus of claim 15 wherein the plurality of mirrors is biased at different heights to form the Hadamard patterns with a diffractive pattern.

18. The apparatus of claim 17 wherein differences in heights of the plurality of mirrors are fractions of a wavelength of the diverging laser beam.

19. The apparatus of claim 15 wherein the detector comprises a single detector.

* * * * *